United States Patent
Inukai et al.

(10) Patent No.: US 7,106,290 B2
(45) Date of Patent: Sep. 12, 2006

(54) METHOD OF DRIVING EL DISPLAY DEVICE

(75) Inventors: Kazutaka Inukai, Kanagawa (JP); Mitsuaki Osame, Kanagawa (JP); Tomoyuki Iwabuchi, Kanagawa (JP)

(73) Assignee: Semiconductor Energy Laboratory Co., Ltd., Atsugi (JP)

( * ) Notice: Subject to any disclaimer, the term of this patent is extended or adjusted under 35 U.S.C. 154(b) by 231 days.

(21) Appl. No.: 09/944,085

(22) Filed: Sep. 4, 2001

(65) Prior Publication Data

US 2002/0047852 A1   Apr. 25, 2002

(30) Foreign Application Priority Data

Sep. 4, 2000   (JP) .................................. 2000-267164

(51) Int. Cl.
G09G 3/36 (2006.01)

(52) U.S. Cl. ............................ 345/92; 345/76; 345/82; 345/204; 345/206; 345/690; 345/692

(58) Field of Classification Search .................. 345/76, 345/82, 92, 204, 206, 690, 692
See application file for complete search history.

(56) References Cited

U.S. PATENT DOCUMENTS

| | | |
|---|---|---|
| 4,773,738 A | 9/1988 | Hayakawa et al. |
| 5,091,722 A | 2/1992 | Kitajima et al. |
| 5,200,846 A | 4/1993 | Hiroki et al. |
| 5,225,823 A | 7/1993 | Kanaly |
| 5,349,366 A | 9/1994 | Yamazaki et al. |
| 5,412,493 A | 5/1995 | Kunii et al. |
| 5,414,442 A | 5/1995 | Yamazaki et al. |
| 5,424,752 A | 6/1995 | Yamazaki et al. |
| 5,471,225 A | 11/1995 | Parks |

(Continued)

FOREIGN PATENT DOCUMENTS

| | | |
|---|---|---|
| EP | 831449 | 3/1998 |
| EP | 838799 | 4/1998 |
| EP | 1058311 A2 | 12/2000 |
| EP | 1058314 A2 | 12/2000 |
| EP | 1 111 574 A2 | 6/2001 |
| EP | 1 148 467 A2 | 10/2001 |
| EP | 1 150 273 | 10/2001 |
| EP | 1 184 833 | 3/2002 |
| EP | 1 187 087 | 3/2002 |
| JP | 07-175439 | 7/1995 |
| JP | 09-172589 | 6/1997 |
| JP | 10-171401 | 6/1998 |
| JP | 2002-023697 | 1/2002 |
| WO | WO99-60557 | 11/1999 |
| WO | WO 99/65012 | 12/1999 |

OTHER PUBLICATIONS

Search Report (Application No. 01121175.2–2205;EP5192) dated Jan. 23, 2004.

(Continued)

*Primary Examiner*—Vijay Shankar
*Assistant Examiner*—Leonid Shapiro
(74) *Attorney, Agent, or Firm*—Fish & Richardson P.C.

(57) ABSTRACT

A method of driving an EL display device in which pseudo contours are difficult to be seen is provided. A method of driving an EL display device in which a plurality of pixels, each having a first TFT, a second TFT, a third TFT, and an organic EL element, are formed has the following: n+m display periods (where n and m are both natural numbers) appear in one frame period; the n+m display periods each correspond to one bit of a digital video signal among n bits of the digital video signal; a plurality of display periods, among the n+m display periods, correspond to the same bit of the digital video signal; and display periods corresponding to other bits of the digital video signal, among the n+m display periods, appear during the plurality of display periods.

45 Claims, 21 Drawing Sheets

U.S. PATENT DOCUMENTS

| | | | |
|---|---|---|---|
| 5,479,283 | A | 12/1995 | Kaneko et al. |
| 5,583,534 | A | 12/1996 | Katakura et al. |
| 5,600,169 | A | 2/1997 | Burgener et al. |
| 5,642,129 | A | 6/1997 | Zavracky et al. |
| 5,642,213 | A | 6/1997 | Mase et al. |
| 5,712,652 | A | 1/1998 | Sato et al. |
| 5,729,308 | A | 3/1998 | Yamazaki et al. |
| 5,767,828 | A | 6/1998 | McKnight et al. |
| 5,798,746 | A | 8/1998 | Koyama |
| 5,969,710 | A | 10/1999 | Doherty et al. |
| 5,986,640 | A | 11/1999 | Baldwin et al. |
| 5,990,629 | A | 11/1999 | Yamada et al. |
| 6,034,659 | A | 3/2000 | Wald et al. |
| 6,040,819 | A | 3/2000 | Someya |
| 6,091,203 | A | 7/2000 | Kawashima et al. |
| 6,157,356 | A | 12/2000 | Troutman |
| 6,184,559 | B1 | 2/2001 | Hayakawa et al. |
| 6,215,466 | B1 | 4/2001 | Yamazaki et al. |
| 6,236,064 | B1 | 5/2001 | Mase et al. |
| 6,246,179 | B1 | 6/2001 | Yamada |
| 6,452,341 | B1 | 9/2002 | Yamauchi |
| 6,518,977 | B1 * | 2/2003 | Naka et al. ............ 345/690 |
| 6,542,138 | B1 | 4/2003 | Shannon et al. |
| 6,563,480 | B1 | 5/2003 | Nakamura |
| 6,617,644 | B1 | 9/2003 | Yamazaki et al. |
| 6,689,492 | B1 | 2/2004 | Yamazaki et al. |
| 6,778,152 | B1 | 8/2004 | Huang |
| 6,791,129 | B1 | 9/2004 | Inukai |
| 6,794,675 | B1 | 9/2004 | Suzuki et al. |
| 2002/0047852 | A1 | 4/2002 | Inukai et al. |
| 2003/0058195 | A1 | 3/2003 | Adachi et al. |
| 2003/0057423 | A1 | 5/2003 | Shimoda et al. |
| 2004/0051142 | A1 | 3/2004 | Yamazaki et al. |
| 2004/0061438 | A1 | 4/2004 | Yamazaki et al. |
| 2004/0065902 | A1 | 4/2004 | Yamazaki et al. |

OTHER PUBLICATIONS

PCT—International Searching Authority Search Report dated Oct. 24, 2002 (7 pages).

Inukai et al.; "36.4L: Late–News Paper: 4.0–in. TFT–OLED Displays and a Novel Digital Driving Method"; 2000 *SID International Symposium Digest of Technical Papers*, vol. 31, pp. 927–927; May 16–18, 2000.

Office Action (Application No. 01121175.2), Nov. 25, 2004, 11 pages.

* cited by examiner

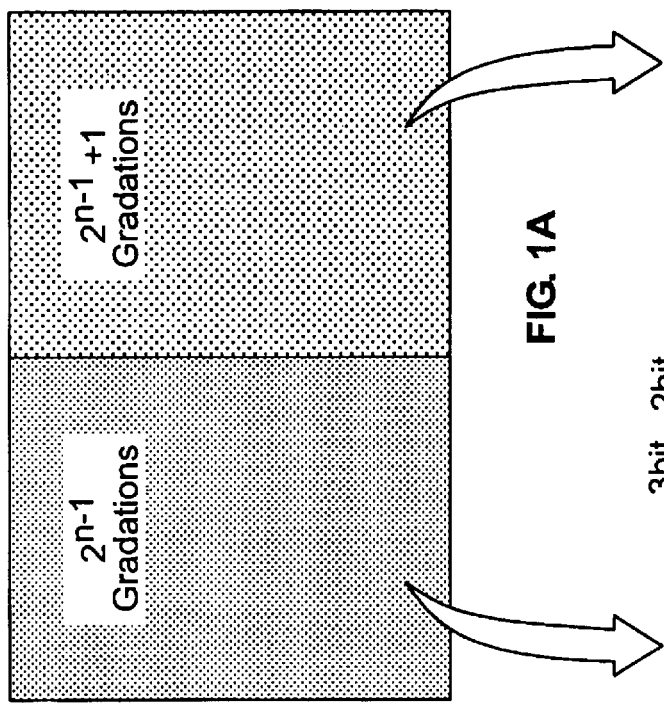
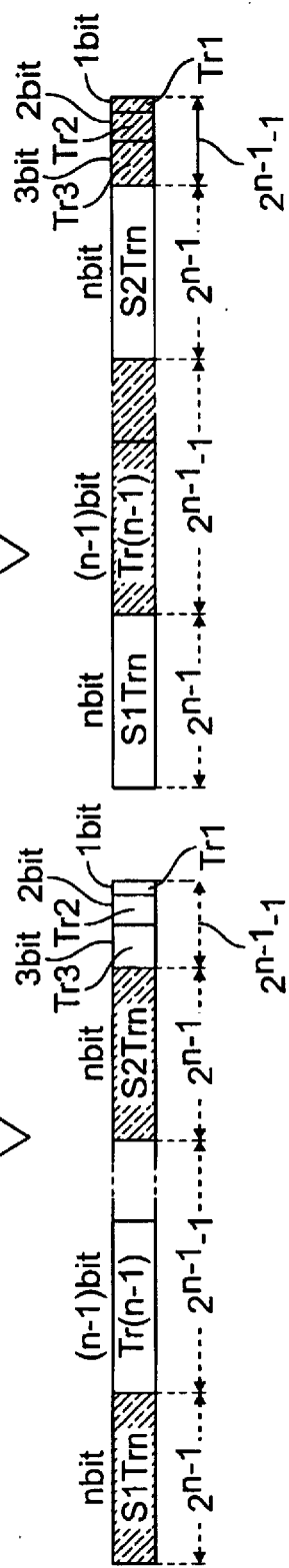
FIG. 1A
FIG. 1B

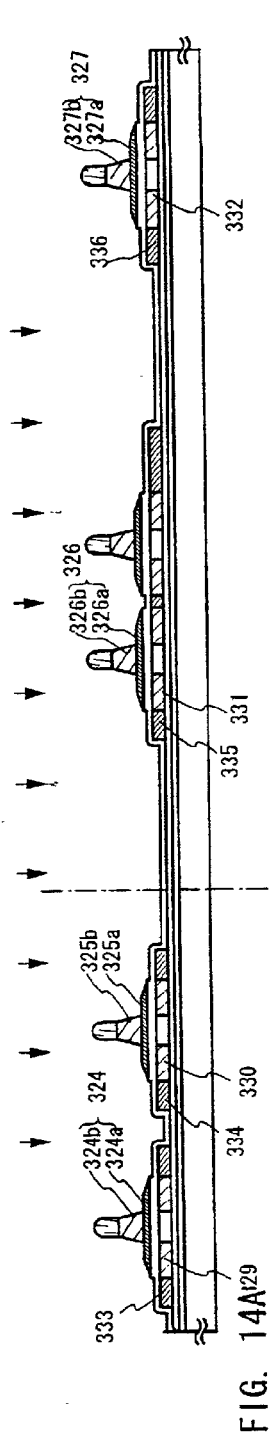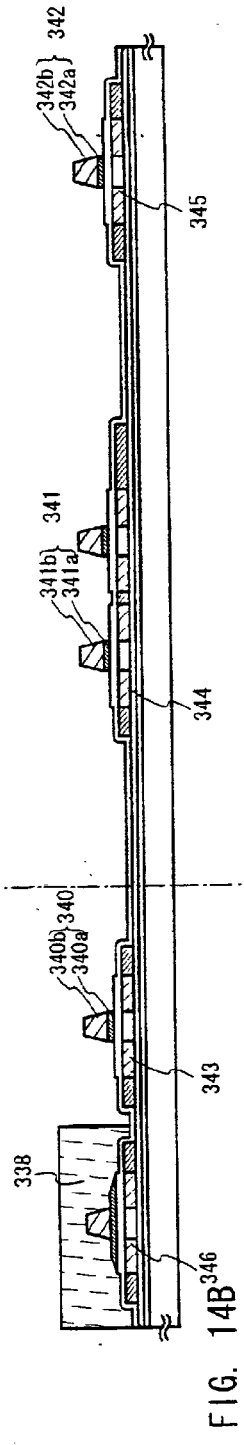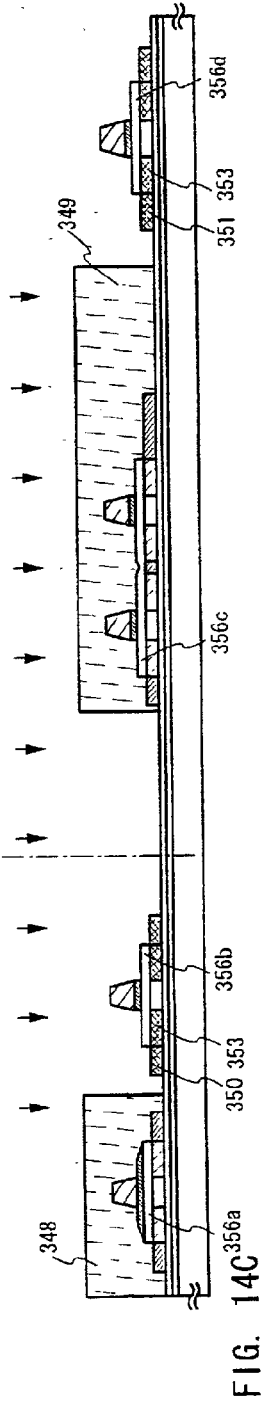
FIG. 14A
FIG. 14B
FIG. 14C

METHOD OF DRIVING EL DISPLAY DEVICE

BACKGROUND OF THE INVENTION

1. Field of the Invention

The present invention relates to a method of driving an EL display device having a panel for performing gradation display in which a plurality of pixels are arranged in a matrix shape and the length during which each pixel is turned on is controlled. In particular, the present invention relates to a method of driving an EL display device having an EL panel using organic EL elements.

2. Description of the Related Art

The introduction of digital technology to equipment and systems used by broadcasters is increasing, and in recent years, the digitalization of broadcast radio waves, that is, research and development toward the realization of digital broadcasting, is being performed worldwide.

Further, dealing with the digitalization of broadcast radio waves, research and development has also been thriving in recent years for active matrix display devices in which a digital video signal having image information is used as is without being converted to analog, to display an image.

A surface area division driving method and a time division driving method can be given as methods for performing gradation display in accordance with the two voltage values of a digital video signal.

The surface area division driving method is a driving method for performing gradation display by dividing one pixel into a plurality of subpixels, and driving each subpixel independently based upon a digital video signal. One pixel must be divided into a plurality of subpixels in this surface area division driving method. In addition, it is also necessary to form pixel electrodes corresponding to the respective subpixels in order to drive the divided subpixels independently. A difficulty thus develops in that the pixel structure is complex.

On the other hand, the time division driving method is a driving method for performing gradation display by controlling the length of time during which pixels are turned on. Specifically, one frame period is divided into a plurality of display periods. Each pixel is then placed in a turned on or turned off state in each display period in accordance with a digital video signal. The gradation of a certain pixel is found by summing the length of the display periods which that pixel is turned on within all of the display periods appearing within one frame period.

In general, the response speed of organic EL materials is fast compared to liquid crystals and the like, and therefore the organic EL materials are suitable for time division drive.

Binary code is convenient in realizing high-level gradations when performing time division drive. A case of displaying mid-level gradations by time division drive in accordance with a simple binary code method is explained in detail below using FIGS. 19A and 19B.

FIG. 19A shows a pixel portion of a display device, and the lengths of all display periods appearing within one frame period in the pixel portion are shown in FIG. 19B.

An image is displayed using a 6 bit digital video signal capable of displaying gradations 1 to 64 in FIGS. 19A and 19B. The right half of the pixel portion performs display of 33 (32+1) gradations, and the left half of the pixel portion performs display of 32 (31+1) gradations.

Six display periods (display periods Tr1 to Tr6) generally appear within one frame period when using a 6 bit digital video signal. The first to the sixth bits of the digital video signal correspond to the display periods Tr1 to Tr6 respectively.

The ratio of lengths of the display periods Tr1 to Tr6 becomes $2^0:2^1:2^2:2^3:2^4:2^5$. The length of the display period Tr6 corresponding to the most significant bit (the sixth bit in this case) of the digital video signal is the longest, and the length of the display period corresponding to the least significant bit (the first bit) of the digital video signal is the shortest.

For a case of performing display of the 32nd gradation, the pixels are placed in an on state in the display periods Tr1 to Tr5, and the pixels are placed in an off state during the display period Tr6. Further, for a case of performing display of the 33rd gradation, the pixels are placed in a turned off state during the display periods Tr1 to Tr5, and are turned on during the display period Tr6.

A pseudo contour may be visible at a boundary portion between the portion for performing display of the 32nd gradation and the portion for performing display of the 33rd gradation.

The term pseudo contour refers to an unnatural contour line repeatedly visible when performing time gradation display in accordance with a binary code method, and it is said that the main cause of the pseudo contour is fluctuations which develop in the perceived brightness due to the characteristics of human vision. A mechanism of the generation of the pseudo contour is explained using FIGS. 20A and 20B.

FIG. 20A shows a pixel portion of a display device in which a pseudo contour develops, and FIG. 20B shows the ratio of the lengths of display periods appearing within one frame period in the pixel portion.

An image is displayed using a 6 bit digital video signal capable of displaying gradations 1 to 64 in FIGS. 20A and 20B. The right half of the pixel portion performs display of 33 gradations, and the left half of the pixel portion performs display of 32 gradations.

The pixels are placed in an on state during 31/63 of one frame period, and the pixels are placed in an off state during 32/63 of the one frame period, in portions of the pixel portion performing display of the 32nd gradation. Periods during which the pixels are turned on appear alternately with periods in which the pixels are turned off.

Further, the pixels are placed in an on state during 32/63 of one frame period and the pixels are placed in an off state during 31/63 of the one frame period, in portions of the pixel portion performing display of the 33rd gradation. Periods during which the pixels are turned on appear alternately with periods in which the pixels are turned off.

For a case of displaying a moving picture, the interface between portions displaying the 32nd gradation and portions displaying the 33rd gradation in FIG. 20A is taken, for example, as moving in the direction of the dotted line. Namely, the pixels near the boundary switch over between displaying the 32nd Gradation and displaying the 33rd gradation. By doing so, a turn on period for displaying the 33rd gradation begins immediately after a turn on period for displaying the 32nd gradation in the pixels near the boundary. The human eye thus can see the pixels turned on continuously during one frame period. This is perceived as an unnatural bright line on the screen.

Conversely the interface between the portions displaying the 32nd gradation and the portions displaying the 33rd gradation in FIG. 20A is taken, for example, as moving in the direction of the solid line. Namely, the pixels near the boundary switch over between displaying the 33rd gradation and displaying the 32nd gradation, By doing so, the turn on period for displaying the 32nd gradation begins immediately after the turn on period for displaying the 33rd gradation in the pixels near the boundary. The human eye thus can see the pixels turned off continuously during one frame period. This is perceived as an unnatural dark line on the screen.

These types of unnatural bright lines and dark lines appearing on the screen are obstructions to display, referred to as pseudo contours (moving pseudo contours).

Obstructions to display also become visible in static images due to the same cause as that in which the moving pseudo contours develop in moving images. The obstructions to display static images are one in which flickering motion can be seen in the boundaries of gradations. A simple explanation of the reason that this type of obstructions to display is visible in static images is made below.

Even if a person's eye is fixed upon one point, the visual point moves slightly, and it is difficult to stare at one point with certainty. Therefore, even if ones intention is to stare at the boundary between portions of the pixel portion in which the pixels are performing display of the 32nd gradation, and portions in which the pixels are performing display of the 33rd gradation, the visual point will actually move slightly left and right, up and down.

For example assume that the visual point moves from portions performing display of the 32nd gradation to portions performing display of the 33rd gradation as shown by the dashed line. For a case in which the pixels are in a turned off state when the visual point is located in portions displaying the 32nd gradation, and the pixels are in a turned off state when the visual point is located in portions displaying the 33rd gradation, the pixels are seen to be in a turned off state through the entire one frame period by an observer's eyes.

Conversely, for example, assume that the visual point moves from portions performing display of the 33rd gradation to portions performing display of the 32nd gradation, as shown by the solid line. For a case in which the pixels are in a turned on state when the visual point is located in portions displaying the 33rd gradation, and the pixels are in a turned on state when the visual point is located in portions displaying the 32nd gradation, the pixels are seen to be in a turned on state through the entire one frame period by an observer's eyes.

The pixels are therefore seen by human eyes to be in a turned on state, or in a turned off state, throughout one frame period because of the tiny movement to the left and right, up and down, of the visual point, and obstructions to display in which the boundary portion is seen to sway back and forth is seen.

SUMMARY OF THE INVENTION

The applicants of the present invention divided the longest display period into a plurality of display periods (divided display periods) in accordance with a fixed rule in order to prevent pseudo contours from being seen. The plurality of divided display periods are then distributed within one frame period so as not to appear in succession.

There may be one divided display period, and there may be a plurality of divided display periods. However, it is preferable that a display period corresponding to the most significant bit, in other words, the longest display period, be divided in order in accordance with a fixed rule.

Further, it is possible for a designer to appropriately select the number of divided display periods, but it is preferable that the amount of divisions be determined by the balance of the driving speed for a display device and the required display quality of an image.

Furthermore, it is preferable that the length of divided display periods corresponding to the same bit of a digital video signal be the same, but the present invention is not limited to this. It is not always necessary to make the length of the divided display periods the same.

In accordance with the above structure, obstructions to display, such as pseudo contours, which are conspicuous in time division drive by a binary code method, can be prevented from being visible.

The structures of the present invention are discussed below.

According to the present invention, there is provided a method of driving an EL display device in which a plurality of pixels, each having a first TFT, a second TFT, a third TFT, and an organic EL element, are formed, characterized in that:

n+m display periods (where n and m are both natural numbers) appear in one frame period;

the n+m display periods each correspond to one bit of a digital video signal among n bits of the digital video signal;

a plurality of display periods among the n m display periods, correspond to the same bit of the digital video signal;

other display periods corresponding to other bits of the digital video signal, among the n+m display periods, appear between the plurality of display periods;

for each of the n+m display periods, the corresponding bit of the digital video signal is input to a gate electrode of the second TFT by the first TFT turning on, and the respective display periods begin by the third TFT turning off;

after each of the n+m display periods begins, the respective display periods are completed by the beginning of another display period, or by the third TFT turning on; and the organic EL element emits light when the second TFT is turned on, and does not emit light when the second TFT is turned off.

According to the present invention, there is provided a method of driving an EL display device in which a plurality of pixels, each having a first TFT, a second TFT, a third TFT, and an organic EL element, are formed, characterized in that:

n+m display periods (where n and m are both natural numbers) appear in one frame period;

the n+m display periods each correspond to one bit of a digital video signal among n bits of the digital video signal;

a plurality of display periods, among the n+m display periods, correspond to the most significant bit of the digital video signal;

other display periods corresponding to other bits of the digital video signal, among the n+m display periods, appear between the plurality of display periods;

for each of the n+m display periods, the corresponding bit of the digital video signal is input to a gate electrode of the second TFT by the first TFT turning on, and the respective display periods begin by the third TFT turning off;

after each of the n+m display periods begins, the respective display periods are completed by the beginning of another display period, or by the third TFT turning on; and the organic EL element emits light when the second TFT is turned on, and does not emit light when the second TFT is turned off.

According to the present invention, there is provided a method of driving an EL display device in which a plurality of pixels, each having a first TFT, a second TFT, a third TFT, and an organic EL element, are formed, characterized in that:

n+m display periods (where n and m are both natural numbers) appear in one frame period;

the n+m display periods each correspond to one bit of a digital video signal among n bits of the digital video signal;

upper bits of the digital video signal correspond to a plurality of display periods among the n+m display periods, respectively;

other display periods corresponding to other bits of the digital video signal, among the n+m display periods, appear between the plurality of display periods;

for each of the n+m display periods, the corresponding bit of the digital video signal is input to a gate electrode of the second TFT by the first TFT turning on, and the respective display periods begin by the third TFT turning off;

after each of the n+m display periods begins, the respective display periods are completed by the beginning of another display period, or by the third TFT turning on; and the organic EL element emits light when the second TFT is turned on, and does not emit light when the second TFT is turned off.

According to the present invention, there is provided a method of driving an EL display device in which a plurality of pixels, each having a first TFT, a second TFT and an organic EL element, are formed, wherein:

n+m display periods (where n and m are both natural numbers) appear in one frame period;

the n+m display periods each correspond to one bit of a digital video signal among n bits of the digital video signal;

a plurality of display periods, among the n+m display periods, correspond to the same bit of the digital video signal;

other display periods corresponding to other bits of the digital video signal, among the n+m display periods, appear between the plurality of display periods:

for each of the n+m display periods, the corresponding bit of the digital video signal is input to a gate electrode of the second TFT by the first TFT turning on;

after each of the n+m display periods begins, the respective display periods are completed by the beginning of another display period; and the organic EL element emits light when the second TFT is turned on, and does not emit light when the second TFT is turned off.

According to the present invention, there is provided a method of driving an EL display device in which a plurality of pixels, each having a first TFT, a second TFT, and an organic EL element, are formed, wherein:

n+m display periods (where n and m are both natural numbers) appear in one frame period;

the n+m display periods each correspond to one bit of a digital video signal among n bits of the digital video signal;

a plurality of display periods, among the n+m display periods, correspond to the most significant bit of the digital video signal;

other display periods corresponding to other bits of the digital video signal, among the n+m display periods, appear between the plurality of display periods;

for each of the n+m display periods, the corresponding bit of the digital video signal is input to a gate electrode of the second TFT by the first TFT turning on;

after each of the n+m display periods begins, the respective display periods are completed by the beginning of another display period; and the organic EL element emits light when the second TFT is turned on, and does not emit light when the second TFT is turned off.

According to the present invention, there is provided a method of driving an EL display device in which a plurality of pixels, each having a first TFT, a second TFT, and an organic EL element, are formed, wherein:

n+m display periods (where n and m are both natural numbers) appear in one frame period;

the n+m display periods each correspond to one bit of a digital video signal among n bits of the digital video signal;

upper bits of the digital video signal correspond to a plurality of display periods among the n+m display periods;

other display periods corresponding to other bits of the digital video signal, among the n m display periods, appear between the plurality of display periods;

for each of the n+m display periods, the corresponding bit of the digital video signal is input to a gate electrode of the second TFT by the first TFT turning on;

after each of the n+m display periods begins, the respective display periods are completed by the beginning of another display period; and the organic EL element emits light when the second TFT is turned on, and does not emit light when the second TFT is turned off.

In the present invention, the method may be characterized in that the first TFT and the second TFT have the same polarity.

In the present invention, the method may be characterized in that $Tr_1, Tr_2, Tr_3, \ldots, Tr_{n-1} = 2^0, 2^1, 2^2, \ldots, 2^{n-2}, 2^{n-1}$, where the lengths of the display periods, among the n+m display periods, corresponding to respective bits of the digital video signal are taken as $Tr_1, Tr_2, Tr_3, \ldots Tr_{n-1}, Tr_n$.

BRIEF DESCRIPTION OF THE DRAWINGS

In the accompanying drawings:

FIGS. 1A and 1B are diagrams showing a pixel portion of an EL display using a driving method of the present invention, and the ratio of the lengths of a display period and divided display periods, respectively;

FIGS. 14A to 14C are diagrams showing the method of manufacturing an EL display;

DETAILED DESCRIPTION OF THE PREFERRED EMBODIMENTS

[Embodiment Mode 1]

A case of displaying an intermediate gradation by a time division driving method of the present invention is explained in detail below using FIGS. 1A and 1B.

FIG. 1A shows a pixel portion of a display device, and the ratio of the lengths of display periods Tr that appear in one frame period F in FIG. 1B.

In FIGS. 1A and 1B, an image is displayed using an n-bit digital video signal capable of displaying gradations from 1 to $2^n$. The right half of the pixel portion performs display of $2^{n-1}+1$ gradations, and the left half performs display of $2^{n-1}$ gradations.

N display periods (display periods Tr1 to Trn) appear within one frame period for a case of using the n-bit digital video signal in accordance with a simple binary code method. The first bit of the digital video signal to the n-th bit of the digital video signal correspond to the display periods Tr1 to Trn, respectively.

The ratio of the lengths of the display periods Tr1 to Trn becomes $2^0:2^1:2^2:\ldots:2^{n-2}:2^{n-1}$. The length of the display period Trn corresponding to the most significant bit (the n-th bit in this case) of the digital video signal is the longest, and the length of the display period Tr1 corresponding to the least significant bit (the first bit) of the digital video signal is the shortest.

For a case of performing display of $2^{n-1}$ gradations, the pixels are placed in an on state in the display periods Tr1 to Tr(n−1), and the pixels are placed in an off state during the display period Trn. Further, the pixels are placed in a turned off state during the display periods Tr1 to Tr(n−1), and are turned on during the display period Trn, when performing display of $2^{n-1}+1$ gradations.

The display period Tr having the longest period is then divided into two divided display periods (S1Trn and S2Trn) in this embodiment mode. Note that although the display period Trn is divided into two divided display periods in this embodiment mode, the present invention is not limited to this. Provided that there are two or more divided display periods, any number of divided display periods may be provided, limited by the operation speed of a driver circuit and pixel TFTs.

The divided display periods do not appear in succession. A display period corresponding to another bit of the digital video signal always appears between two divided display periods.

Note that the lengths of the divided display periods may not be the same. Further, it is not necessary to place any limitations on the order of the display periods which are not divided. There are no limitations on setting the order from the display period corresponding to the most significant bit to the display period corresponding to the least significant bit.

A reason that obstructions to display such as pseudo contours are difficult to be seen in the driving method of the present invention is discussed next using FIGS. 2A and 2B.

Figure 2A:
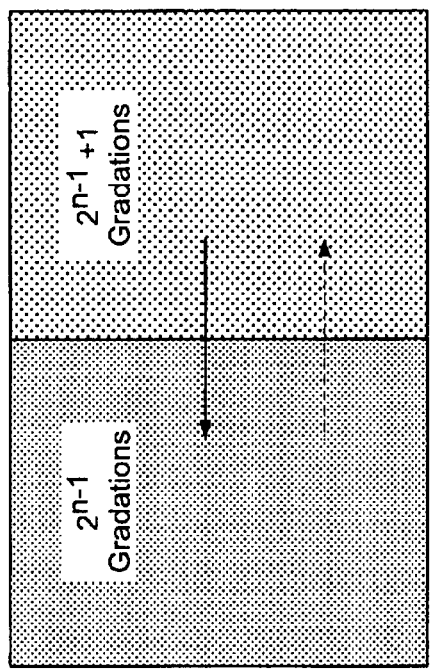
FIGS. 2A and 2B are diagrams showing the pixel portion of the EL display using the driving method of the present invention, and the ratio of the lengths of display periods and non-display periods, respectively.
Figure 2B:
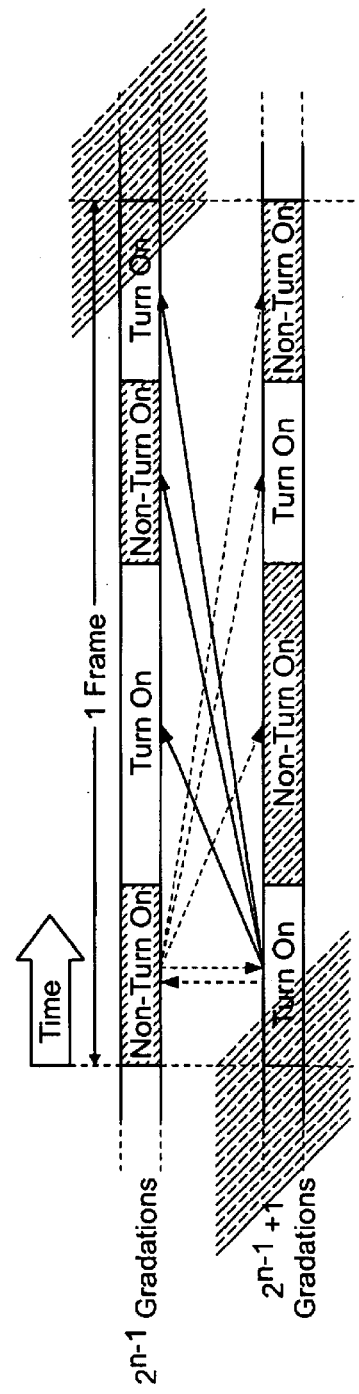

FIG. 2A shows a pixel portion of a display device for performing display by a driving method of the present invention, and FIG. 2B shows the lengths of display periods and divided display periods appearing within one frame period, in accordance with a turn on period and a turn off (non-turn on) period of a pixel.

The right half of the pixel portion performs display of $2^{n-1}+1$ gradations, and the left half performs display of $2^{n-1}$ gradations in FIG. 2A.

In portions of the pixel portion performing display of $2^{n-1}$ gradations, the pixels are placed in an on state in $2^{n-1}-1/2^n$ periods within one frame period, and the pixels are placed in an off state in $2^{n-1}/2^n$ periods within the one frame period. The periods during which the pixels are in an turned on state and the periods in which the pixels are in a turned off state then appear alternately.

Further, in portions of the pixel portion performing display of $2^{n-1}+1$ gradations, the pixels are placed in a turned on state in $2^{n-1}/2^n$ periods within one frame period, and the pixels are placed in a turned off state in $2^{n-1}-1/2^n$ periods within the one frame period. The periods during which the pixels are in a turned on state and the periods in which the pixels are in a turned off state then appear alternately.

The turn on periods and the turn off periods are divided and appear alternately within one frame period, and the visual point of a person moves slightly left and right, up and down, and therefore it is sufficiently possible that other display periods or divided display periods are straddled. In this case, even if the visual point of an observer is fixed continuously on only turned off pixels, and conversely, fixed continuously on only turned on pixels, pseudo contours can be prevented from being visible since the lengths of successive turn on periods or turn off periods are shorter compared with conventional drive in accordance with a simple binary code method.

For example, the visual point is taken as moving from a portion displaying $2^{n-1}$ gradations to a portion displaying $2^{n-1}+1$ gradations as indicated by the dashed line. With the driving method of the present invention, even if the pixels are in a turned off state when the visual point is located in portions displaying $2^{n-1}$ gradations and even if the pixels are in a turned on state when the visual point moves to portions displaying $2^{n-1}+1$ gradations, the sum of two turn off periods appearing in succession becomes shorter than that for a conventional driving method. Therefore, the visualization by human eyes that the pixels are always in a turned off state throughout one frame period can be prevented.

Conversely, for example, the visual point is taken as moving from a portion displaying $2^{n-1}+1$ gradations to a portion displaying $2^{n-1}$ gradations. With the driving method of the present invention, even if the pixels are in a turned on state when the visual point is located in portions displaying $2^{n-1}+1$ gradations, and even if the pixels are in a turned on state when the visual point moves to portions displaying $2^{n-1}$ gradations, the sum of two turn on periods appearing in succession becomes shorter than that for the conventional driving method. Therefore, the visualization by human eyes that the pixels are always in a turned on state throughout one frame period can be prevented.

In accordance with the above structure, obstructions to display such as pseudo contours, which are conspicuous in time division drive by a binary code method, can be prevented from being visible.

[Embodiment Mode 2]

Only the display period corresponding to the most significant bit of the digital video signal is divided into divided display periods in Embodiment Mode 1. In Embodiment Mode 2, an example of dividing display periods corresponding to a plurality of upper bits of a digital video signal, selected in order successively from the most significant bit, into pluralities of divided display periods, respectively is shown. Note that, in this specification, the term upper bits corresponds to display periods divided into divided display periods, and the term lower bits corresponds to display periods which are not divided into divided display periods.

Figure 3:
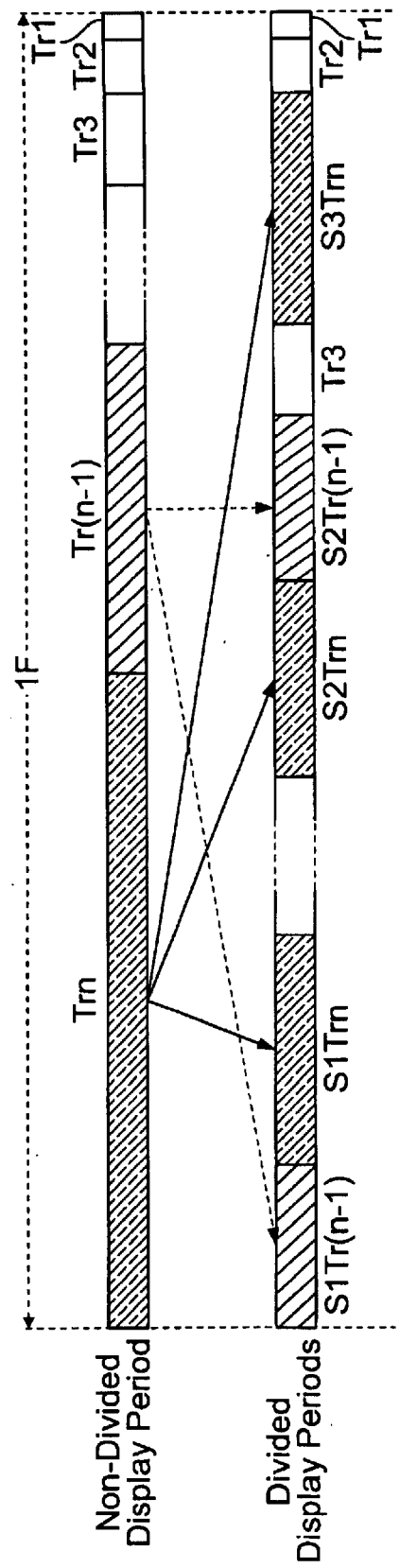
FIG. 3 is a diagram showing the ratio of the lengths of display periods and divided display periods for a case of dividing a plurality of display periods into divided display periods.

A driving method of Embodiment Mode 2 is explained using FIG. 3. FIG. 3 shows the ratio of the lengths of display periods Tr and divided display periods STr appearing within one frame period F in a pixel portion, when performing time division gradation display using an n-bit digital video signal.

In Embodiment Mode 2, the display period Trn and the display period Tr(n−1) are taken as display periods corresponding to upper bits of a digital video signal. Note that, in Embodiment Mode 2, although a method of driving is shown in which two bits, the number n bit and the number (n−1) bit, are taken as upper bits, the present invention is not limited to this. The number of upper bits may be set to 1, and may of course be set to two or more. However, it is necessary that all of the upper bits be in succession and in order from the most significant bit. For example, for a case of three upper bits, the number n bit, the number (n−1) bit, and the number (n−2) bit of the digital video signal correspond to the upper bits.

The ratio of the lengths of the display periods Tre1 to Trn becomes $2^0:2^1:2^2:\ldots:2^{n-2}:2^{n-1}$.

The pixels are placed in a turned on state in the display periods Tr1 to Tr(n−1) when performing display of $2^{n-1}$ gradations, and the pixels are placed in a turned off state in the display period Trn. Further, when performing display of $2^{n-1}+1$ gradations, the pixels are placed in a turned off state in the display periods Tr1 to Tr(n−1), and the pixels are placed in a turned on state in the display period Trn.

In Embodiment Mode 2, the display periods corresponding to the upper bits, the display period Trn and the display period Tr(n−1) in Embodiment Mode 2, are divided into three divided display periods (S1Trn, S2Trn, and S3Trn), and into two divided display periods (S1Tr(n−1) and S2Tr(n−1)), respectively, Note that, although three divisions of the display period Trn, and two divisions of the display period Tr(n−1), are formed in Embodiment Mode 2, the present invention is not limited to this. The numbers of divisions of the display periods corresponding to the upper bits are not limited to these values, and provided that the number is equal to or greater than two, it is possible to form any number of divided display periods, limited only by the operation speed of a driver circuit and pixel TFTs.

The divided display periods corresponding to the same bit of the digital video signal do not appear in succession. A subframe period or a display period corresponding to another bit of the digital video signal always appears between two divided display periods.

Note that the lengths of the divided display periods corresponding to the same bit of the digital video signal need not all be the same.

In accordance with the above structure, obstructions to display such as pseudo contours, which are conspicuous in time division drive by a binary code method, can be prevented from being visible.

[Embodiment Mode 3]

A driving method in which a display period is divided into a plurality of divided display periods based on a fixed rule is explained in Embodiment Mode 3 In order to simplify the explanation, a case of performing gradation display using an 8 bit digital video signal is explained in Embodiment Mode 3.

The lengths of display periods corresponding to the number n-bit (where n=1 to 8) of a digital video signal are taken as Ln, and the number of divisions of the display periods is taken as $m_n$. If the value of $Ln/m_n^3$ is found for a case where m=1, 2, 3, 4 . . . at this point, then the results are as shown in Table 1 below.

TABLE 1

| $Ln/mn^3$ | mn = 1 | mn = 2 | mn = 3 | mn = 4 |
|---|---|---|---|---|
| L8 = 128 | 128 | 16 | 4.74 | 2 |
| L7 = 64 | 64 | 8 | 2.37 | 1 |
| L6 = 32 | 32 | 4 | 1.18 | |
| L5 = 16 | 16 | 2 | 0.59 | |
| L4 = 8 | 8 | 1 | | |
| L3 = 4 | 4 | | | |
| L2 = 2 | 2 | | | |
| L1 = 1 | 1 | | | |

The total number of display periods and divided display periods formed within one frame period is set to 13 in Embodiment Mode 3. It is preferable that the lengths of the all of the display periods and the divided display periods be as equal as possible. The visualization of obstructions to display such as pseudo contours can be effectively prevented provided that the lengths of all of the display periods and the divided display periods are equal. The number of divisions of each display period is therefore selected so as to make the values of $Ln/m_n^3$ as equal as possible and make the total number of the display periods and the divided display periods formed in one frame period 13. Further, it is preferable that the display periods corresponding to the upper bits be divided in order from the display period having longer length. In Embodiment Mode 3, the divisions are made as shown by the circled values in Table 2.

TABLE 2

| $Ln/mn^3$ | mn = 1 | mn = 2 | mn = 3 | mn = 4 |
|---|---|---|---|---|
| L8 = 128 | 128 | 16 | (4.74) | 2 |
| L7 = 64 | 64 | (8) | 2.37 | 1 |
| L6 = 32 | 32 | (4) | 1.18 | |
| L5 = 16 | 16 | (2) | 0.59 | |
| L4 = 8 | (8) | 1 | | |
| L3 = 4 | (4) | | | |
| L2 = 2 | (2) | | | |
| L1 = 1 | (1) | | | |

Namely, the display periods Tr1 to Tr4 are not divided, the display periods Tr5 to Tr7 are divided into two, and the display period Tr8 is divided into three. Further, in one frame period the display periods-corresponding to the same bit of the digital video signal are driven so as not to appear in succession.

It is possible for a designer to suitably select the number of divisions of the display periods, but it is preferable that the number be determined in accordance with the balance between the driving speed of the display device and the required display quality of an image.

Further, it is preferable that the lengths of the divided display periods corresponding to the same bit of the digital video signal be the same, but the present invention is not limited to this. It is not always necessary for the lengths of the divided display periods be equal.

Note that there are also cases in which it is possible to effectively prevent visualization of pseudo contours by using $Ln/m_n^2$ as a substitute for the above stated $Ln/m_n^3$ depending on the condition. It is possible for the designer to appropriately select which value to use as a standard when deciding the driving method.

In accordance with the above structure, obstructions to display such as pseudo contours, which are conspicuous in time division drive by a binary code method, can be prevented from being visible.

Embodiments of the present invention are explained below.

[Embodiment 1]

A structure of a pixel portion of an EL display for controlling light emitted from organic EL elements, using two thin film transistors (TFTs) formed in each pixel, and a driving method, are explained in Embodiment 1.

Figure 4:
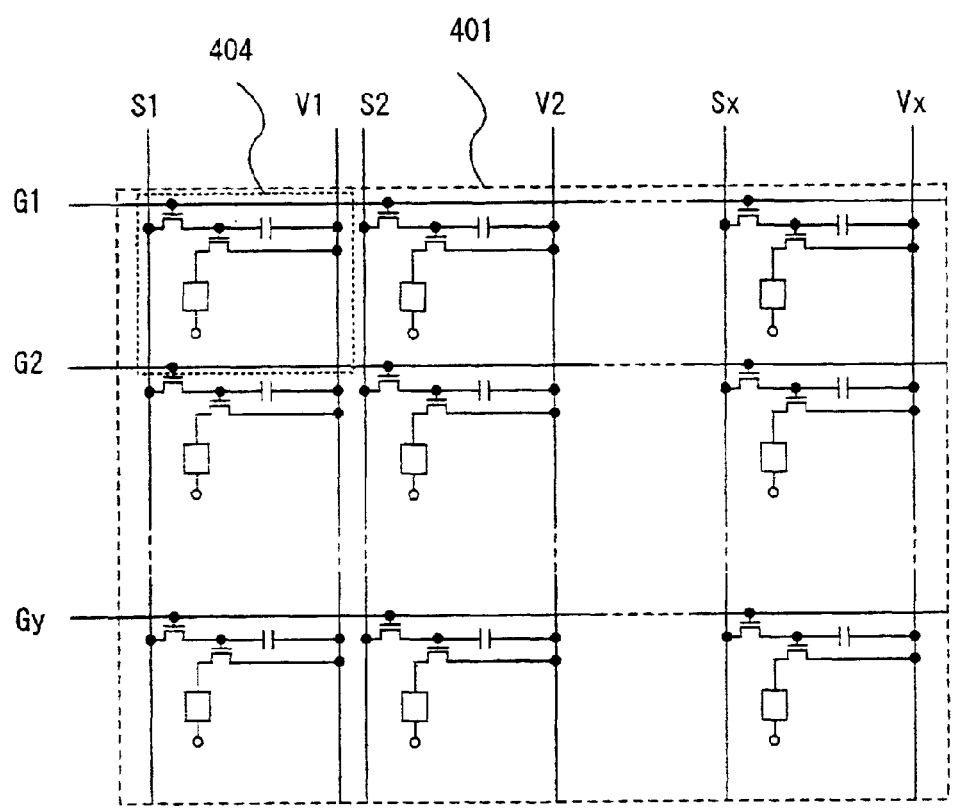
FIG. 4 is a circuit diagram of a pixel portion using a driving method of the present invention.

A blow up diagram of a pixel portion 401 of an EL display of Embodiment 1 is shown in FIG. 4. Source signal lines S1 to Sx, power source supply lines V1 to Vx, and gate signal lines G1 to Gy are formed in the pixel portion 401.

Regions having one of the source signal lines S1 to Sx, one of the power source supply lines V1 to Vx, and one of the gate signal lines G1 to Gy indicate pixels 404 in Embodiment 1. A plurality of the pixels 404 are arranged in a matrix shape in the pixel portion 401.

Figure 5:
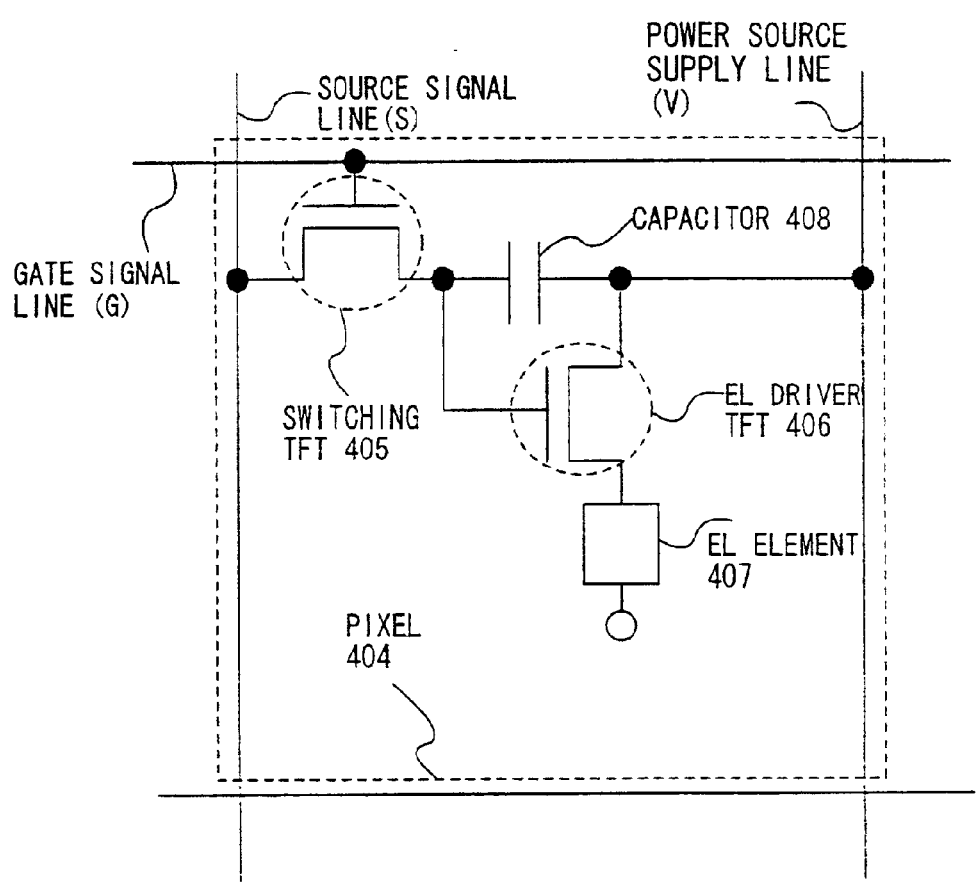
FIG. 5 is a circuit diagram of a pixel using a driving method of the present invention.

A blow up diagram of the pixel 404 is shown in FIG. 5. Reference numeral 405 indicates a switching TFT in FIG. 5. A gate electrode of the switching TFT 405 is connected to a gate signal line G (any one of the gate signal lines G1 to Gy). One of a source region and a drain region of the switching TFT 405 is connected to the source signal line S (any one of the source signal lines S1 to Sx), and the other region is connected to a gate electrode of an EL driver TFT 406 and to a capacitor 408 of each pixel.

The capacitor 408 is formed in order to store a gate voltage (the electric potential difference between a gate electrode and a source region) of the EL driver TFT 406 when the switching TFT 405 is in a non-selected state (off state). Note that, although a structure in which the capacitor 408 is formed is shown in Embodiment 1, the present invention is not limited to this structure, and a structure in which the capacitor 408 is not formed may also be used.

Further, one of a source region and a drain region of the EL driver TFT 406 is connected to the power source supply line V (any one of the power source supply lines V1 to Vx), while the other region is connected to an organic EL element 407. The power source supply line V1 is connected to the capacitor 408.

The organic EL element 407 comprises an anode, a cathode, and an EL layer formed between the anode and the cathode. If the anode is connected to the source region or to the drain region of the EL driver TFT 406, then the anode becomes a pixel electrode and the cathode becomes an opposing electrode. Conversely, if the cathode is connected to the source region or to the drain region of the EL driver TFT 406, then the cathode becomes a pixel electrode and the anode becomes an opposing electrode.

An opposing electric potential is imparted to the opposing electrode of the organic EL element 407. Further, a power source electric potential is imparted to the power source supply line V. The power source electric potential and the opposing electric potential are imparted to the EL display, which uses a driving method of the present invention, by a power source formed by external ICs or the like. The power source electric potential of the power source supply line is maintained at an electric potential having an electric potential difference with the opposing electrode on an order such that the organic EL element emits light when the power source electric potential is imparted to the pixel electrode of the organic EL element.

An electric current density of several $mA/cm^2$ is necessary for the pixel portion for a case where the amount of light emitted per area of the pixel is 200 $cd/m^2$ for a typical organic EL display at present. Therefore, if the screen size becomes large, it becomes difficult to control the size of the electric potential imparted from the power source formed in the IC by a switch. In Embodiment 1, the power source electric potential and the opposing electric potential are always maintained at a constant level, and it is not necessary to control the size of the electric potential imparted from the power source formed in the IC by using a switch. This is useful in achieving a larger screen size panel.

The switching TFT 405 and the EL driver TFT 406 can be formed using n-channel TFTs or p-channel TFTs. However, if the source region or the drain region of the EL driver TFT 406 is connected to the anode of the organic EL element 407, it is preferable that the EL driver TFT 406 be a p-channel TFT. Further, if the source region or the drain region of the EL driver TFT 406 is connected to the cathode of the organic EL element 407, then it is preferable that the EL driver TFT 406 be an n-channel TFT.

The switching TFT 405 and the EL driver TFT 406 may also have a multi-gate structure such as a double gate structure or a triple gate structure, in addition to a single gate structure.

Figure 6:
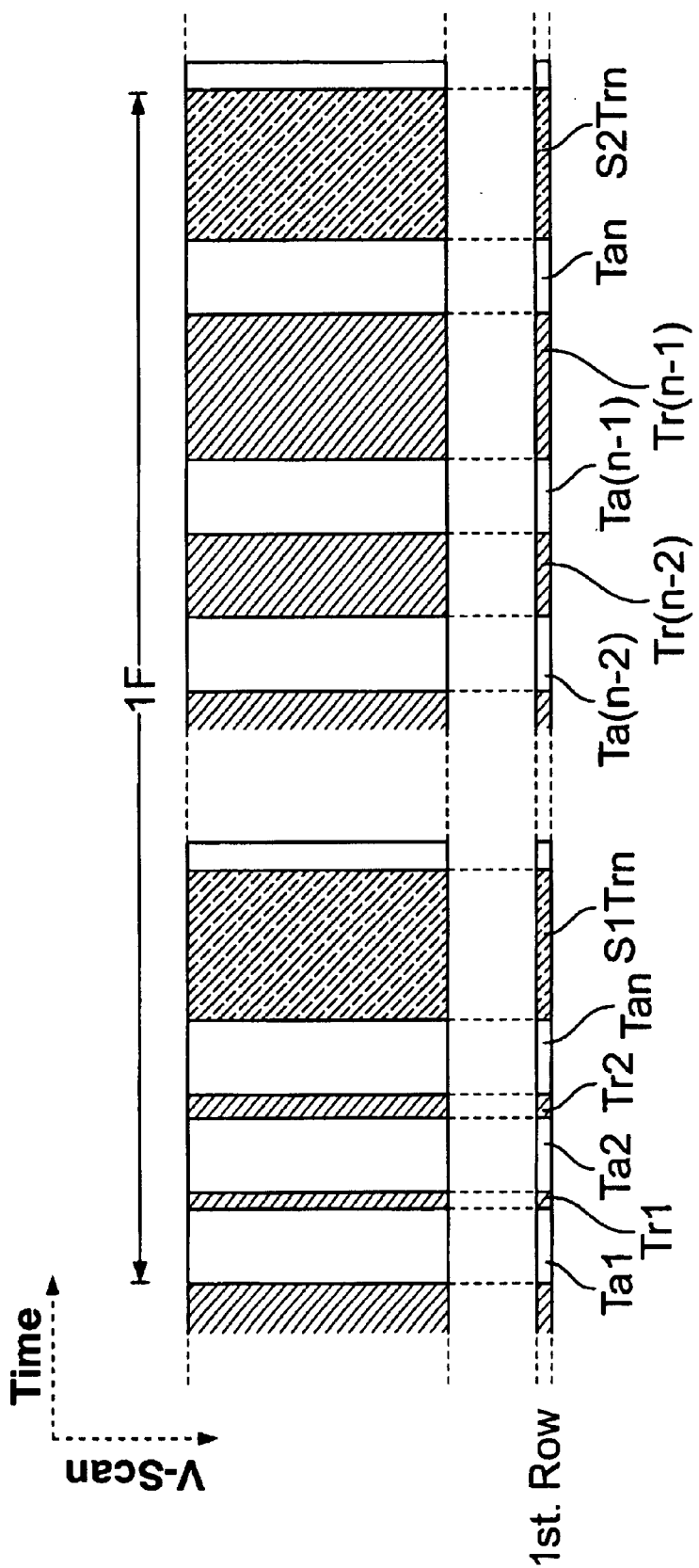
FIG. 6 is a diagram showing a driving method of the present invention.

A method of driving an EL display of the present invention having the structure stated above is explained next using FIG. 6. In FIG. 6, the horizontal axis shows time, while the vertical axis shows the arrangement of the selected gate signal lines.

First, the gate signal line G1 is selected by a gate signal input to the gate signal line G1 from a gate signal line driver circuit. Note that, in this specification, that a gate signal line is selected indicates that all of the switching TFTs 405 connected to the gate signal line are placed in an on state. In other words, the switching TFTs 405 of all pixels (pixels of first line) connected to the gate signal line G1 are in an on state here.

A first bit of a digital video signal is input at the same time to the source signal line S1 to Sx from a source signal line driver circuit. The digital video signal is input to gate electrodes of the EL driver TFTs 406 through the switching TFTs 405.

The EL driver TFTs 406 are placed in an off state in this embodiment for a case of the digital video signal having "0" information. The power source electric potential is therefore not imparted to the pixel electrodes of the organic EL elements 407. As a result, the organic EL elements 407 of the pixels into which the digital video signal having "0" information is input do not emit light.

Note that, that a digital video signal is input to a pixel, indicates, in this specification, that the digital video signal is input to the gate electrode of the organic EL driver TFT of the pixel.

Conversely, the EL driver TFTs 406 are placed in an on state if, "1" information is contained in the digital video signal. The power source electric potential is therefore imparted to the pixel electrodes of the organic EL elements 407. As a result, the organic EL elements 407 of the pixels into which the digital video signal having "1" information is input emit light.

The organic EL elements 407 are thus placed in a light emitting, or non-light emitting, state, and the first line of pixels perform display.

The gate signal line G2 is selected by a gate signal at the same time as the selection of the gate signal line G1 is completed. The switching TFTs 405 of all pixels connected to the gate signal line G2 are then placed in an on state, and the first bit of the digital video signal is input to the second line of pixels from the source signal lines S1 to Sx.

All of the gate signal lines G1 to Gy are then selected in order. A period until all of the gate signal lines G1 to Gy are selected, and the first bit of the digital video signal is input to all of the lines of pixels is referred to as a write in period Ta1.

Note that a period from the beginning of the write in period Ta1 until the beginning of the next write in period to appear (Ta2 in this case) is referred to as a display period Tr1.

The write in period Ta2 begins when the display period Tr1 is completed, and similar to the case of the write in period Ta1, all of the gate signal lines are selected in order. The second bit of the digital video signal is input to all of the pixels. A period through when the second bit of the digital video signal is input to all of the lines of pixels is referred to as the write in period Ta2.

A period from the beginning of the write in period Ta2 until the beginning of the next write in period to appear (a write in period Tan in this case) is referred to as a display period Tr2.

The write in period Tan begins when the display period Tr2 is completed. All of the gate signal lines are then selected in order, similar to the case of the write in period Ta1, and the number n bit of the digital video signal is input to all of the pixels. A period through when the number n bit of the digital video signal is input to all of the lines of pixels is referred to as the write in period Tan.

A period from the beginning of the write in period Tan until the beginning of the next write in period to appear (a write in period Ta3 in this case) is referred to as a divided display period S1Trn.

Display periods Tr3, Tr4 ..., Tr(n−1) appear in order when the divided display period S1Trn is completed, and the corresponding bit of the digital video signal is similarly input to the pixels in the respective periods.

The write in period Tan begins when the display period Tr(n−1) is completed. Similar to the case of the write in period Ta1, all of the gate signal lines are selected in order, and the number n bit of the digital video signal is input to all of the pixels. The period through when the number n bit of the digital video signal is input to all of the lines of pixels is referred to as the write in period Tan.

A period from the beginning of the write in period Tan until the beginning of the next write in period to appear (the write in period Ta1 of the next frame period in this case) is referred to as a divided display period S2Trn.

Note that the divided display period S1Trn and the divided display period S2Trn combined are referred to as a display period Trn.

One image can be displayed when all of the display periods Tr1 to Trn are completed. A period for displaying one image is referred to as one frame period F in the driving method of the present invention. When one frame period is completed, the next frame period begins. The write in period Ta1 then appears again, and the above stated operations are repeated.

In Embodiment 1, it is necessary that the sum of the lengths of all of the write in periods be shorter than one frame period, and also that the ratio of the lengths of the display periods be set such that $Tr1:Tr2:Tr3: \ldots :Tr(n-1):Trn=2^0:2^1:2^2: \ldots :2^{n-2}:2^{n-1}$. The desired gradation display among gradations 1 to $2^n$ can be performed by combining the display periods.

The gradation displayed in a pixel during one frame period is determined by finding the total sum of the lengths of the display periods during which the organic EL element of the pixel emits light within the frame period. For example, if the brightness for a case in which a pixel emits light during all of the display periods, when n=8, is taken to be 100%, then a brightness of 1% can be expressed for a case of the pixel emitting light only during Tr1 and Tr2, and a brightness of 60% can be expressed if the pixel emits light in Tr3, Tr5, and Tr8.

Further, the display periods Tr1 to Trn may appear in any order. For example, it is possible for the display periods to appear in an order of Tr3, Tr5, Tr2, ..., after Tr1 within one frame period. However, it is essential that the divided display period S1Trn and the divided display period S2Trn, corresponding to the same number n bit of the digital video signal, do not appear in succession.

Note that, although the sizes of the power source electric potential and the opposing electric potential are always fixed in Embodiment 1, the present invention is not limited to this. The sizes of the power source electric potential and the opposing electric potential may be maintained as the same in the write in period. And the power source electric potential and the electric potential of the opposing electrode may always have an electric potential difference such that the organic EL elements emit light when the power source electric potential is imparted to the pixel electrode of the organic EL element at the same time as the write in period is completed.

In this case, the write in period is not included within the display period. The display period corresponds to a period from the completion of a write in period until the beginning of the next write in period to appear. For example, the display period Tr1 is a period from the completion of the write in period Ta1 until the next write in period to appear (for example, Ta2) after the write in period Ta1.

In accordance with the above structure, obstructions to display such as pseudo contours, which are conspicuous in time division drive by a binary code method, can be prevented from being visible.

Note that, although in Embodiment 1 the display period Trn is divided into two, the divided display periods S1Trn and S2Trn, Embodiment 1 is not limited to this. There may be one display period which is divided, or a plurality of display periods which are divided. However, it is preferable that they be divided in order from the display period corresponding to the upper bit, namely the display period having longer length. Further, it is possible for a designer to suitably select the number of divisions of the display period, but it is preferable that the amount of the divisions be determined by the balance between the driving speed of a display device and the required display quality of an image.

Furthermore, although it is preferable that the lengths of the divided display periods corresponding to the same bit of the digital video signal be equal, the present invention is not limited to this. It is not always necessary that the lengths of the divided display periods be the same.

[Embodiment 2]

In this embodiment, the structure of a pixel portion of an EL display, which control the luminescence of the organic EL element and a driving method is explained using a three thin film transistor provided in each pixels.

Figure 7:
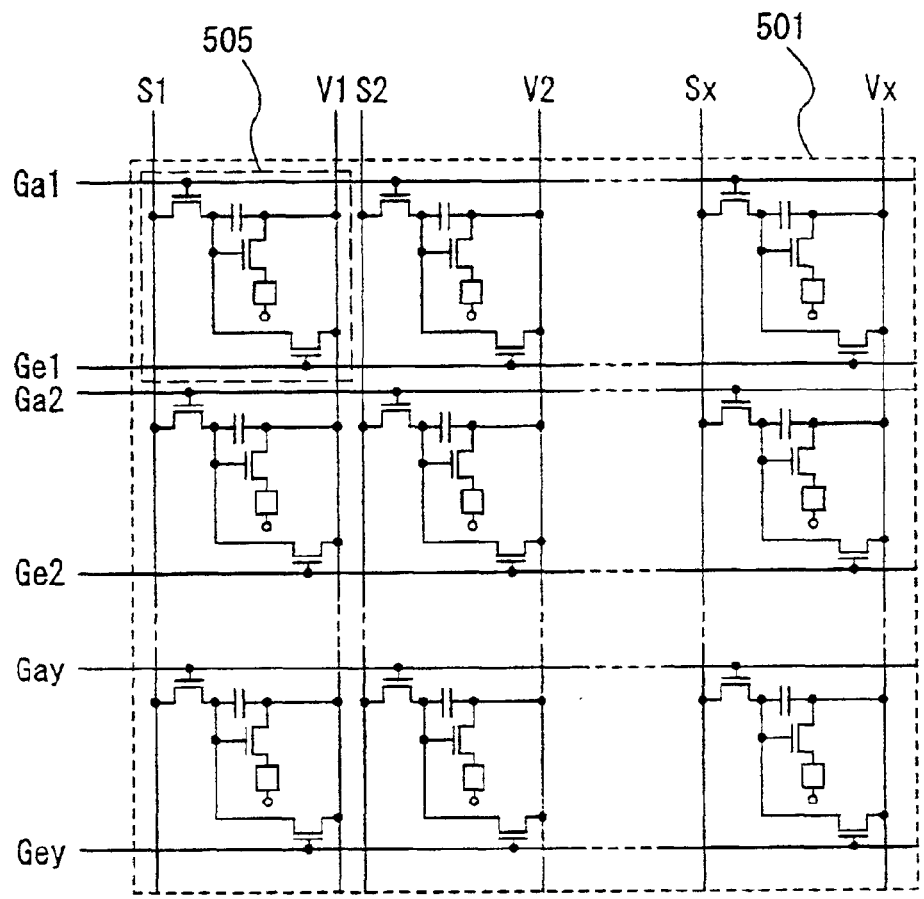
FIG. 7 is a circuit diagram of a pixel portion using a driving method of the present invention.

The pixel portion 501 of an EL display of the present invention is shown in an enlarged scale in FIG. 7. This pixel portion 501 is provided with: source signal lines (S1 to Sx); current supply lines (V1 to Vx) writing gate signal lines (or first gate signal lines) (Ga1 to Gay); and erasing gate signal lines (or second gate signal lines)(Ge1 to Gey).

A pixel 505 is the region which is provided with one of the source signal lines (S1 to Sx), one of the current supply lines (V1 to Vx), one of the writing gate signal lines (Ga1 to Gay) and one of the erasing gate signal lines (Ge1 to Gey). In the pixel portion 501, a plurality of pixels 505 are arrayed in the matrix shape.

Figure 8:
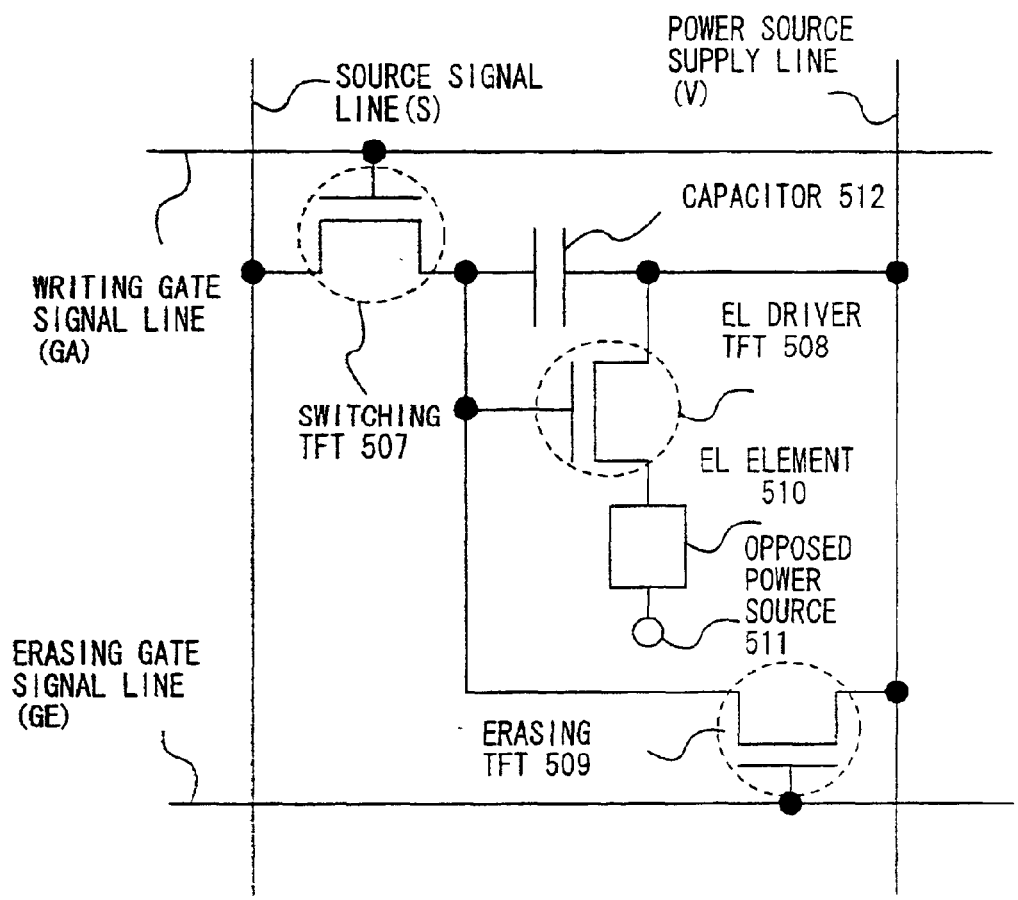
FIG. 8 is a circuit diagram of a pixel using a driving method of the present invention.

The pixel 505 is shown in an enlarged scale in FIG. 8. In FIG. 8. numeral 507 designates a switching TFT. A gate electrode of the switching TFT 507 is connected with a writing gate signal line Ga (a line among Ga1 to Gay). One of the source region and the drain region of the switching TFT 507 is connected with the source signal line (a line among S1 to Sx), whereas the other is connected with the gate electrode of an EL driver TFT 508, a capacitor 512 owned by each pixel and the source region or the drain region of an erasing TFT 509.

The capacitor 512 is provided for retaining the gate voltage of the EL driver TFT 508 when the switching TFT 505 is in the unselected state (or OFF state). In this embodiment, there is shown the construction having the capacitor 512, to which the invention should not be limited, but the construction may be modified not to have the capacitor 512.

On the other hand, one of the source region and the drain region of the EL driver TFT 508 is connected with the current supply line V (a line among V1 to Vx), whereas the other is connected with an organic EL element 510. The current supply line V is connected with the capacitor 512.

Of the source region and the drain region of the erasing TFT 509, on the other hand, the one which is not connected with the source region or the drain region of the switching TFT 507 is connected with the current supply line V. Moreover, a gate electrode of the erasing TFT 509 is connected with an erasing gate signal line Ge (a line Ge1 to Gex).

The organic EL element 510 comprises an anode, a cathode and an EL layer formed between an anode and a cathode. Where the anode is connected with the source region or the drain region of the EL driver TFT 508, the anode acts as the pixel electrode whereas the cathode acts as the opposed electrode. Where the cathode is connected with the source region or the drain region of the EL driver TFT 508, on the contrary, the cathode acts as the pixel electrode whereas the anode acts as the opposed electrode.

The organic EL element 510 is applied at its opposed electrode with an opposed potential. Moreover, the potential difference between the opposed potential and the supply potential is always kept at such a level for the organic EL element to luminesce when the supply potential is applied to the pixel electrode. These supply potential and opposed potential are applied by the power source which is provided in the EL display device using a driver method of the invention by an external IC or the like. Here, the power source for the opposed potential will be especially called the "opposed power source 511".

The typical EL display at the present stage is required to have a current of several $mA/cm^2$ per the area of the pixel unit where the luminescence per the luminescent area of the pixel is 200 $cd/m^2$. As the screen size becomes the larger, therefore, it becomes the more difficult to control the level of the potential to be applied from the power source of the IC, with the switch. In the invention, the supply potential and the opposed potential are always kept constant, and the level of the potential to be applied from the power source of the IC need not be controlled with the switch so that the invention is useful for realizing a panel having a larger screen size.

The switching TFT 507, the EL driver TFT 508 and the erasing TFT 509 to be used may either the n-channel TFT or the p-channel TFT. On the other hand, the switching TFT 507, the EL driver TFT 508 and the erasing TFT 509 should not be limited to have the single-gate structure but may have a multi-gate structure such as a double-gate structure or a triple-gate structure.

The drive method of the EL display device according to the invention, as shown in FIGS. 7 to 8, will be described with reference to FIG. 9. The axis of ordinate shows the time and the axis of abscissa shows the position of a gate signal line.

At first, the display period Tr1 is started at the pixels of the first line, the writing gate signal line Ga1 is selected with a writing gate signal (or a first gate signal) to be inputted from the writing gate signal line driver circuit (not illustrated) to the writing gate signal line Ga1. And, there are turned ON the switching TFTs 507 of all the pixels (i.e., the pixels of the first line) which are connected with the wiring gate signal line Ga1.

Simultaneously with this, the digital video signal of the first bit, as inputted from the source signal line driver circuit 502 to the source signal lines S1 to Sx, is inputted through the switching TFT 507 to the EL driver TFT 508.

The digital video signal has the information "0" or "1", and one of the digital video signals "0" and "1" has a "Hi" voltage whereas the other has a "Lo" voltage.

In this embodiment, the EL driver TFT 508 is OFF w here the digital video signal has information "0". Therefore, the supply potential is not applied to the pixel electrode of the organic EL element 510. As a result, the organic EL element 510, to which the digital video signal having the information "0" is inputted, does not luminesce.

Where the digital video signal has the information "1", on the contrary, the EL driver TFT 508 is ON. Therefore, the supply potential is applied to the pixel electrode of the organic EL element 510. As a result, the organic EL element 510, to which the digital video signal having the information "1 " is inputted, luminesce.

In this embodiment, where the digital video signal has the information "0", the EL driver TFT 508 is turned OFF. Where the digital video signal has the information "1", the EL driver TFT 508 is turned ON. However, the invention is not limited to this construction. The EL drier TFT 508 may be turned ON, where the digital video signal has the information "0", and may be turned OFF where the digital video signal has the information "1".

Thus, simultaneously with the input of the digital video signal to the pixels of the first line, the organic EL element 510 does or does not luminesce, and the pixels of the first line display.

Where the selection of the writing gate signal line Ga1 is ended, the writing gate signal line Ga2 is selected with the writing gate signal. Then, the switching TFTs 507 of all the pixels connected with the writing gate signal line Ga2 are turned ON, so that the digital video signals of the first bit are inputted to the pixels of the second line from the source signal lines S1 to Sx.

Then, all the writing gate signal lines Ga1 to Gay are sequentially selected so that the digital video signals of the first bit are inputted to all the pixels. The time period till the digital video signals of the first bit are inputted to all the pixels is the writing period Ta1, In the pixels of each line, the timing of starting the writing period Ta1 has a time difference.

Further, the time period during the pixel is displaying is referred to the display period Tr, For example in the case of first line pixel, display period Tr is started simultaneously with the writing gate signal Ga1 is selected. The timing of starting the display period of each line is different.

Before the digital video signals of the first bit are inputted to all the pixels, that is, before the writing period Ta1 is ended, on the other hand, the erasing gate signal line Ge1 is selected in parallel with the inputting of the digital video signals of the first bit to the pixels, with the erasing gate signal (or the second gate signal) which is inputted from the erasing gate signal line driver circuit (not illustrated) to the erasing gate signal line Ge1. Then, the erasing TFT 509 of all the pixels (i.e., the pixels of the first line) connected with the erasing gate signal line Ge1 is turned ON. Then, the supply potential of the current supply lines V1 to Vx is applied to the gate electrode of the EL driver TFT 508 through the erasing TFT 509.

When the supply potential is applied to the gate electrode of the EL driver TFT 508, the gate electrode and the source region of the EL driver TFT 508 take the same potential so that the gate voltage is at 0 V. The EL driver TFT 508 is turned OFF. Specifically, the digital video signal, which has been retained by the gate electrode of the EL driver TFT 508 after the writing gate signal line Ga1 was selected with the writing gate signal, is erased by applying the supply potential to the gate electrode of the EL driver TFT. As a result, the supply potential is not applied to the pixel electrode of the organic EL element 510, and none of the organic EL elements 510 owned by the pixels of the first line luminesces so that the pixels of the first line do not display.

When the selection of the erasing gate signal line Ge1 is ended, moreover, the erasing gate signal line Ge2 is selected so that the erasing TFT 509 of all the pixels (i.e., the pixels of the second line) connected with the erasing gate signal line Ge2 is turned ON. Then, the supply potential of the current supply lines V1 to Vx is applied through the erasing TFT 509 to the gate electrode of the EL driver TFT 508. When the supply potential is applied to the gate electrode of the EL driver TFT 508, this EL driver TFT 508 is turned OFF. The supply potential is not applied to the pixel electrode of the organic EL element 510. As a result, none of the organic EL elements 510 owned by the pixels of the second line luminesces to establish the state in which the pixels of the second line do not luminesce.

Then, the erasing gate signal is inputted sequentially to all the erasing gate signal lines. The time period till all the erasing gate signal lines Ge1 to Gey are selected so that the digital video signals of the first bit retained by all the pixels are erased is the "erasure period Te1". In each line, the timing of starting the writing period Te has a time difference.

Further, the time that the pixels do not display is referred to non-display period Td. For example, a pixels of the first line, the display period Tr1 is ended simultaneously when the erasing gate signal Ge1 is selected, to the non-display period. Likewise the display period, the timing of starting non-display period of each line is different.

Before the digital video signals of the first bit retained by all the pixels are erased, that is, before the erasure period Te1 is ended, on the other hand, the writing gate signal line Ga1 is selected again with the writing gate signal in parallel with the erasure of the digital video signals of the first bit retained by the pixels. Then, the digital video signals of the second bit are inputted to the pixels of the first line. As a result, the pixels of the first line displaying, again so that the non-display period Td1 is ended.

The time period till the writing period which will exist next (in the case the writing period Ta2) is started from the writing period Ta1 is started is the display period Tr1.

Next, the display period Tr2 is started to a writing period Ta2. And as the same, all of the writing gate signal line is selected sequentially, and digital video signal of the second bit is inputted to all pixels.

Before the digital video signals of the second bit are inputted to all the pixels, that is, before the writing period Ta2 is ended, on the other hand, the erasing gate signal line Ge1 is selected with the erasing gate signal in parallel with the inputting of the digital video signals of the second bit to the pixels. Therefore, none of the EL elements owned by the pixels of the first line luminesces so that the pixels of the first line do not display. Therefore, the display period Tr2 is ended in the pixels of the first line to a non-display period Td2.

Then, all the erasing gate signal lines Ge2 to Gey are sequentially selected so that the digital video signals of the second bit retained in all the pixels are erased. The time period till the digital video signals of the second bit retained by all the pixels are erased is the "erasure period Te2".

Next, the display period Tr2 is ended to display period Tr3. Likewise, all the writing gate signal lines are selected sequentially, the digital video signals of the third bit are inputted to all pixels.

Before the digital video signals of the third bit are inputted to all the pixels, that is, before the writing period Ta3 is ended, on the other hand, the erasing gate signal line Ge1 is selected with the erasing gate signal in parallel with the inputting of the digital video signals of the third bit to the pixels. Therefore, none of the organic EL elements owned by the pixels of the first line luminesces so that the pixels of the first line do not display. Therefore, the display period Tr3 is ended in the pixels of the first line to a non-display period Td3.

Then, all the erasing gate signal lines Ge2 to Gey are sequentially selected so that the digital video signals of the third bit retained in all the pixels are erased, The time period till the digital video signals of the third bit retained by all the pixels are erased is the "erasure period Te3".

Next, the display period Tr3 is ended to a divisional display period S1Trn. Likewise, all the writing gate signals are sequentially selected so that the digital video signals of the n bit are inputted to all the pixels.

Before the digital video signals of the n bit are inputted to all the pixels, that is, before the writing period Tan is ended on the other hand, the erasing gate signal line Ge1 is selected with the erasing gate signal in parallel with the inputting of the digital video signals of the n bit to the pixels. Therefore, none of the organic EL elements owned by the pixels of the first line luminesces so that the pixels of the first line do not display. Therefore, the display period Trn is ended in the pixels of the first line to a non-display period Td3.

Then, all the erasing gate signal lines Ge2 to Gey are sequentially selected so that the digital video signals of the n bit retained in all the pixels are erased. The time period till the digital video signals of the n bit retained by all the pixels are erased is the "erasure period Ten".

The aforementioned actions are repeated till the digital video signals of the m-th bit are inputted to the pixels, so that the display period Tr, the divisional display period STr and the non-display period Td repeat their appearances. The display period Tr1 continues from the start of the writing period Ta1 to the start of the erasure period Te1. On the other hand, the non-display period Td1 continues from the start of the erasure period Te1 to the start of the writing period (i.e. the writing period Ta2 in this case) to next appear. Moreover, the display periods Tr2, Tr3, - - - , and Tr(m−1) and the non-display periods Td2, Td3, - - - , and Td(m−1) are individually determined like the display period Tr1 and the non-display period Td1 by the writing period Ta1, Ta2, - - -, and Tam and the erasure periods Te1, Te2, - - - , and Te(m−1).

Figure 9:
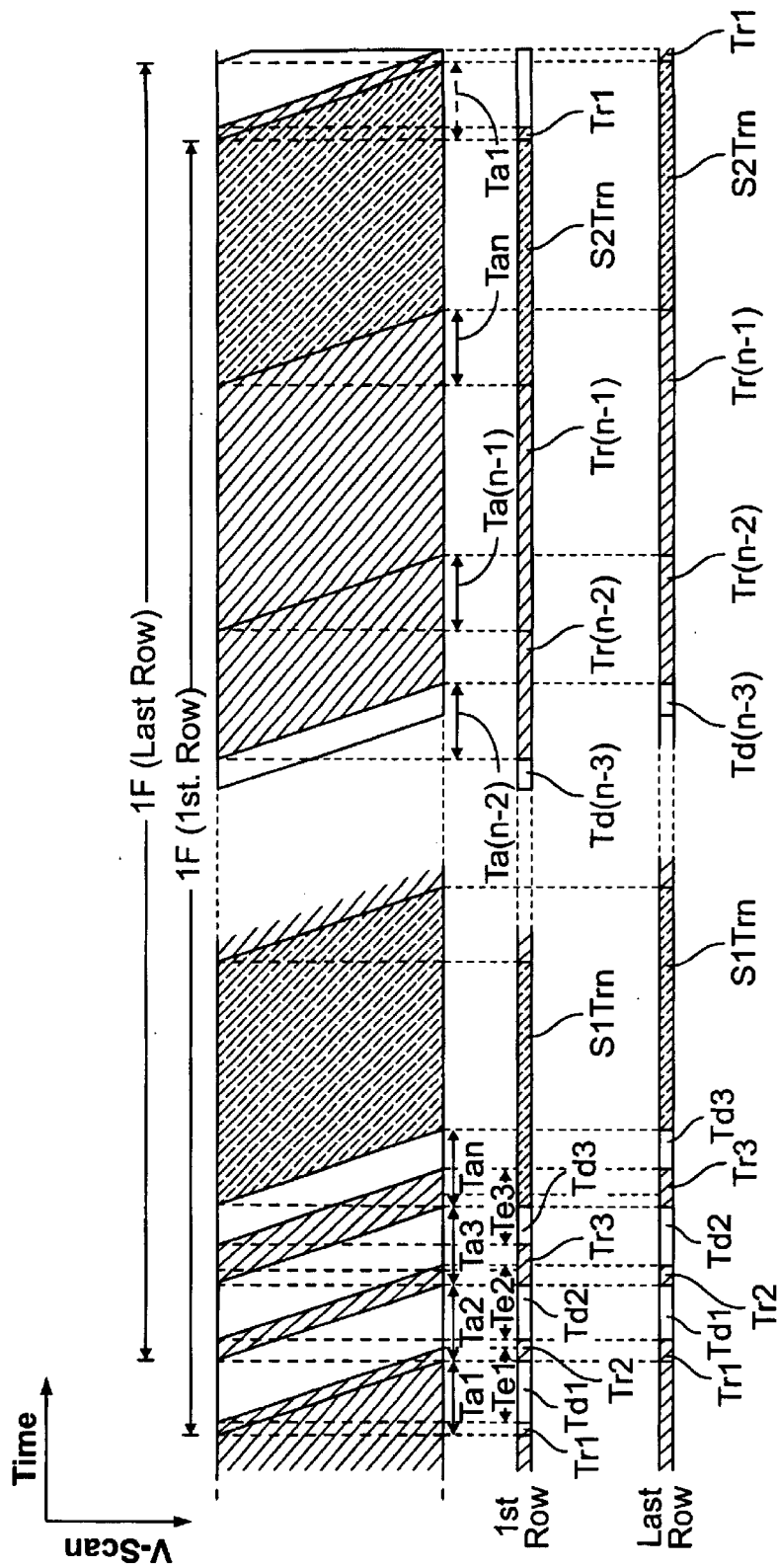
FIG. 9 is a diagram showing a driving method of the present invention.

For conveniences of the description, FIG. 9 exemplifies the case of m=n−2. However, it is natural that the invention should not be limited thereto. In the invention, the value from 1 to n can be arbitrarily selected for m.

When the digital video signals of the m-th [(n−2)-th (the following parenthesized case is for m n−2) bit are inputted to the pixels of the first line, these pixels of the first line display for the display period Trm[n−2]. Then, the digital video signals of the m[n−2]-th bit are retained in the pixels till the digital video signals of the next bit are inputted.

When the display period Tr(m 1)(n−1) are started and when the digital video signals of the (m+1)[n−1]-th bit are then inputted to the pixels of the first line, the digital video signals of the m[n−2]-th bit retained in the pixels are rewritten to the digital video signals of the (m+1)[n−1]-th bit. Then, the pixels of the first line are displayed for the display period Tr(m+1)[n−1]. The digital video signals of the (m+1)[n−1]-th bit are retained in the pixels till the digital video signals of the next bit are inputted.

When the divisional display period S1Trn are started and when the digital video signals of the n bit are then inputted to the pixels of the first line, the digital video signals of the (m+1)[n−1]-th bit retained in the pixels are rewritten to the digital video signals of the n bit. Then, the pixels of the first line are displayed for the display period Trn. The digital video signals of the n bit are retained in the pixels till the digital video signals of the next bit are inputted.

The display periods Trm[n−2], - - - , and Trn continue from the starts of the writing periods Tam[n−2], - - - , and Tan to the strarts of the writing periods to next appear.

When all the display periods Tr1 to Trn are ended, one image can be displayed. In the invention, the period for one image to be displayed is called the "one frame period (F)".

After end of one frame period, moreover, the writing gate digital line Ga1 is selected again with the writing gate signal. Then, the digital video signals of the first bit are inputted to the pixels of the first one take again the display period Tr1. Then, the aforementioned actions are repeated again.

In the driving method of Embodiment 2, it is important that the sum of the lengths of all of the write in periods be shorter than one frame period. Further, the display period Trn is divided into two divided display periods S1Trn and S2Trn with the driving method of Embodiment 2. It is therefore necessary that the lengths of the display periods be set such that Tr:Tr2:Tr3: . . . :Tr(n−1):2×Trn=$2^0$:$2^1$:$2^2$: . . . : $2^{n-2}$: $2^{n-1}$. The desired gradation display among gradations 1 to $2^n$ can be performed by combining the display periods.

The gradation displayed in a pixel during one frame period is determined by finding the total sum of the lengths of the display periods during which the organic EL element of the pixel emits light within the frame period. For example, if the brightness for a case in which a pixel emits light during all of the display periods, when n=8, is taken to be 100%, then a brightness of 1% can be expressed for a case of the pixel emitting light only during Tr1 and Tr2, and a brightness of 60% can be expressed if the pixel emits light in Tr3, Tr5, and Tr8.

It is essential that a write in period Tam for writing in the number m bit of the digital video signal to the pixels be shorter than a display period Trm. It is therefore necessary that the value of the bit number m be a value, among 1 to n, such that the write in period Tam is shorter than the display period Trm.

Further, the display periods Tr1 to Trn may appear in any order. For example, it is possible for the display periods to appear in an order of Tr3, Tr5, Tr2, . . . after Tr1 within one frame period. However, it is preferable that the display periods Tr1 to Trn have an order so as not to mutually overlap. Further, it is also preferable that the erasure periods Te1 to Ten have an order so as not to mutually overlap.

In accordance with the above structure, obstructions to display such as pseudo contours, which are conspicuous in time division drive by a binary code method, can be prevented from being visible.

Note that, although in Embodiment 2 the display period Trn is divided into two, the divided display periods S1Trn and S2Trn, Embodiment 2 is not limited to this. There may be one display period to be divided, or a plurality of display periods to be divided. However, it is preferable that they be divided in order from the display period corresponding to the upper bit, namely the display period having longer length, Further, it is possible for a designer to suitably select the number of divisions of the display period, but it is preferable that the amount of the divisions be determined by the balance between the driving speed of a display device and the required display quality of an image.

Furthermore, although it is preferable that the lengths of the divided display periods corresponding to the same bit of the digital video signal be equal, the present invention is not limited to this. It is not always necessary that the lengths of the divided display periods be the same.

Note that, differing from the driving method shown in Embodiment 1, it is possible to make the period during which the organic EL elements emit light be shorter than the write in period in Embodiment 2. The ratio of the total sum of the lengths of the display periods in one frame period (duty ratio) is therefore not determined only by the length of the write in period.

Note that, although a structure is shown in Embodiment 2 in which a capacitor is formed in order to maintain the voltage applied to the gate electrode of the EL driver TFT, it is also possible to omit the capacitor. For a case in which the EL driver TFT has an LDD region formed so as to overlap with the gate electrode through a gate insulating film, a parasitic capacitance generally referred to as a gate capacitance is formed in the region. This gate capacitance may also be actively used as a capacitor for storing the voltage applied to the gate electrode of the EL driver TFT.

The capacitance value of the gate capacitance changes in accordance with the surface area at which the gate electrode and the LDD region overlap, and therefore the capacitance value is determined by the length of the LDD region included in the overlapping region.

[Embodiment 3]

Detailed structures of the source signal line driver circuit and the gate signal line driver circuit used in order to drive the pixel portion shown in FIG. 4 are explained in Embodiment 3.

Figure 10A:
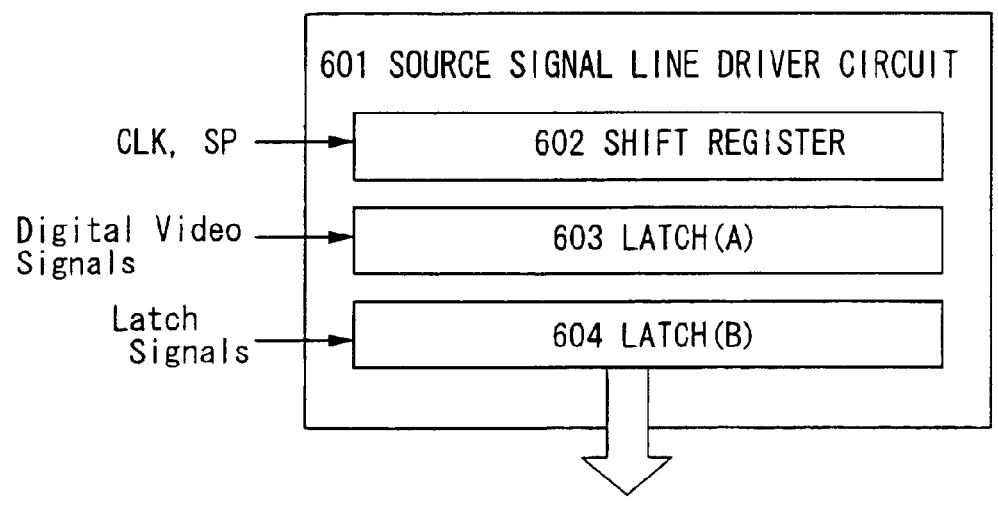
FIGS. 10A and 10B are block diagrams of a driver circuit.
Figure 10B:
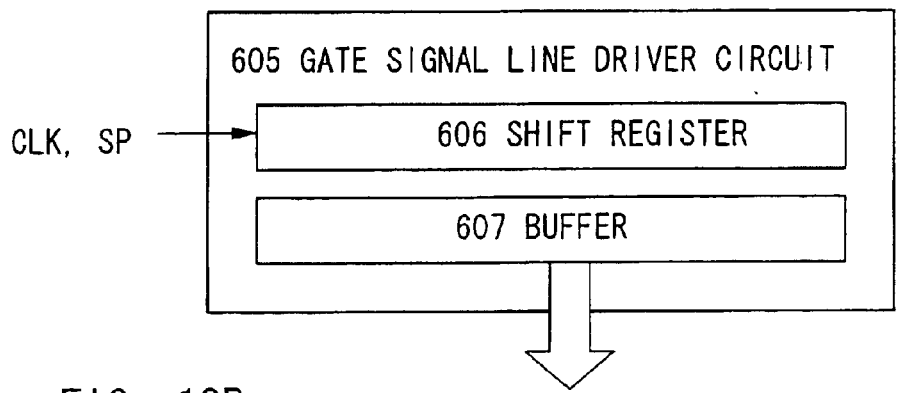

FIGS. 10A and 10B are block diagrams of driver circuits of an EL display of Embodiment 3. FIG. 10A is a source signal line driver circuit 601 having a shift register 602, a latch (A) 603, and a latch (B) 604.

A clock signal CLK and a start pulse SP are input to the shift register 602 in the source signal line driver circuit 601. The shift register 602 generates timing signals in order based upon the clock signal CLK and the start pulse SP, and supplies the timing signals one after another to downstream circuits through a circuit such as a buffer (not shown in the figures).

The timing signals from the shift register 602 may be buffer-amplified by a circuit such as a buffer. The load capacitance (parasitic capacitance) of a wiring to which the timing signal is supplied is large because many circuits or elements are connected to the wiring. The buffer is formed in order to prevent bluntness in the rise and fall of the timing signal, which develops due to the large load capacitance. Note that it is not always necessary to form the buffer.

The timing signals buffer-amplified by the buffer are supplied to the latch (A) 603. The latch (A) 603 has a plurality of latch stages for processing an n-bit digital video signal. The latch (A) 603 writes in and maintains the n-bit digital video signal supplied from the outside of the source signal line driver circuit 601 when the timing signal is input.

Note that the digital video signal may also be input in order to the plurality of latch stages of the latch (A) 603 when writing in the digital video signal to the latch (A) 603. However, the present invention is not limited to this structure. The plurality of latch stages of the latch (A) 603 may be divided into some groups, and the digital video signal may be input to the groups at the same time in parallel, that is, partitioned driving may be performed. Note that the number of group at this time is referred to as the number of divisions. For example, this is referred to as gradation drive with four divisions when the latches are divided into groups every four stages.

The period until the digital video signal is completely written into all of the latch stages of the latch (A) 603 is referred to as a line period. In practice, there may be a case where the line period includes the period in which a horizontal return period is added to the above line period.

A latch signal is supplied to the latch (B) 604 when one line period is completed. The digital video signal written into and stored in the latch (A) 603 is sent all at once at this instant to the latch (B) 604, and is written into all of the latch stages of the latch (B) 604, and stored.

Write in of the digital video signal is again performed, in order, to the latch (A) 603 that has completed sending the digital data signal to the latch (B) 604, based on the timing signal from the shift register 602.

The digital video signal written into and stored in the latch (B) 604 is input to the source signal lines during the second line period.

FIG. 10B is a block diagram showing a structure of a gate signal line driver circuit.

A gate signal line driver circuit 605 has a shift register 606 and a buffer 607. Further, the gate signal line driver circuit 605 may also have a level shifter, depending upon the circumstances.

A timing signal from the shift register 606 is supplied to the buffer 607 in the gate signal line driver circuit 605, and the timing signal is supplied to the corresponding gate signal line. The gate electrodes of the switching TFTs for one line of pixels are connected to the gate signal line. The switching TFTs of all of the one line of pixels must be placed in an on state simultaneously, and the buffer in which a large electric current can be flown is therefore used.

[Embodiment 4]

In Embodiment 4, an example of manufacturing an EL display device which uses a driving method of the present invention is explained using FIGS. 11A and 11B, and FIGS. 12A to 12C.

Figure 11A:
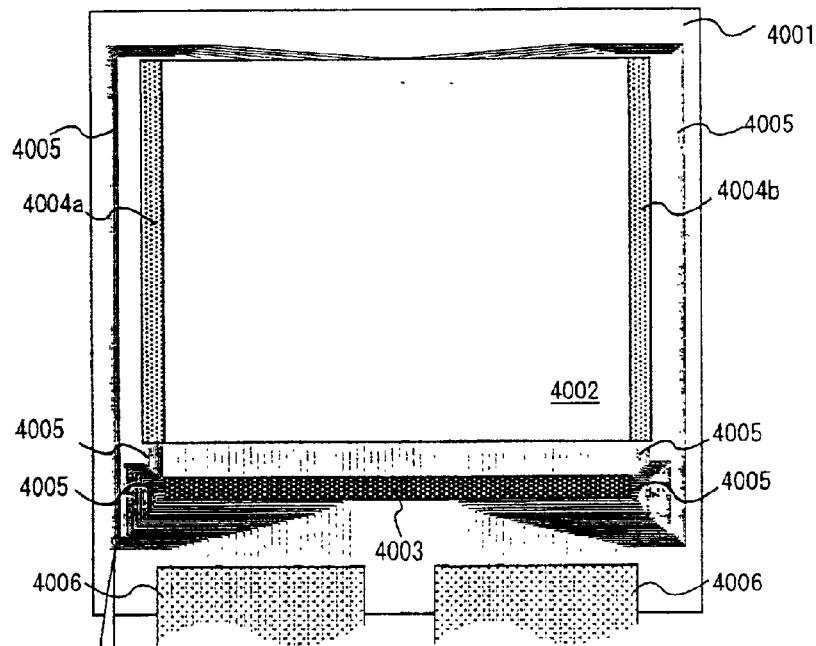
FIGS. 11A and 11B are top surface diagrams of an EL display.

FIG. 11A is a top surface diagram of a TFT substrate of the EL display using the driving method of the present invention. Note that the term TFT substrate indicates a substrate on which a pixel portion is formed in this specification.

A pixel portion 4002, a source signal line driver circuit 4003, a first gate signal line driver circuit 4004a, and a second gate signal line driver circuit 4004b are formed on a substrate 4001. Note that the number of source signal line driver circuits and gate signal line driver circuits in the present invention is not limited to the number shown in FIG. 11A. It is possible for a designer to suitable set the number of source signal line driver circuits and gate signal line driver circuits. Further, the source signal line driver circuit and the gate signal line driver circuits are formed on the TFT substrate in Embodiment 4, but the present invention is not limited to this. A source signal line driver circuit and gate signal line driver circuits formed on a substrate separate from the TFT substrate may also be electrically connected to the pixel portion through means such as an FPC.

Reference numeral 4005 indicates extraction wirings. The extraction wirings 4005 are connected through an FPC 4006 to an IC or the like formed externally to the substrate 4001.

Figure 11B:
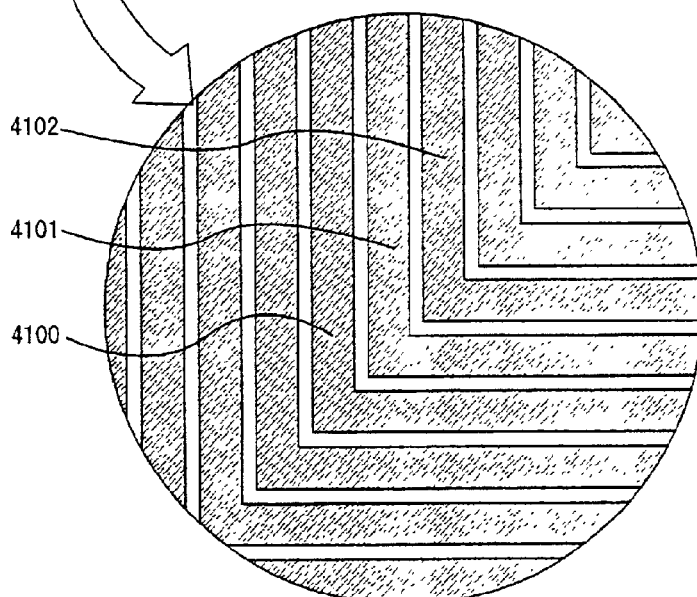

A blow up diagram of the extraction wirings 4005 is shown in FIG. 11B. Reference numeral 4100 indicates an R extraction wiring, reference numeral 4101 indicates a G extraction wiring, and reference numeral 4102 indicates a B extraction wiring.

Figure 12A:
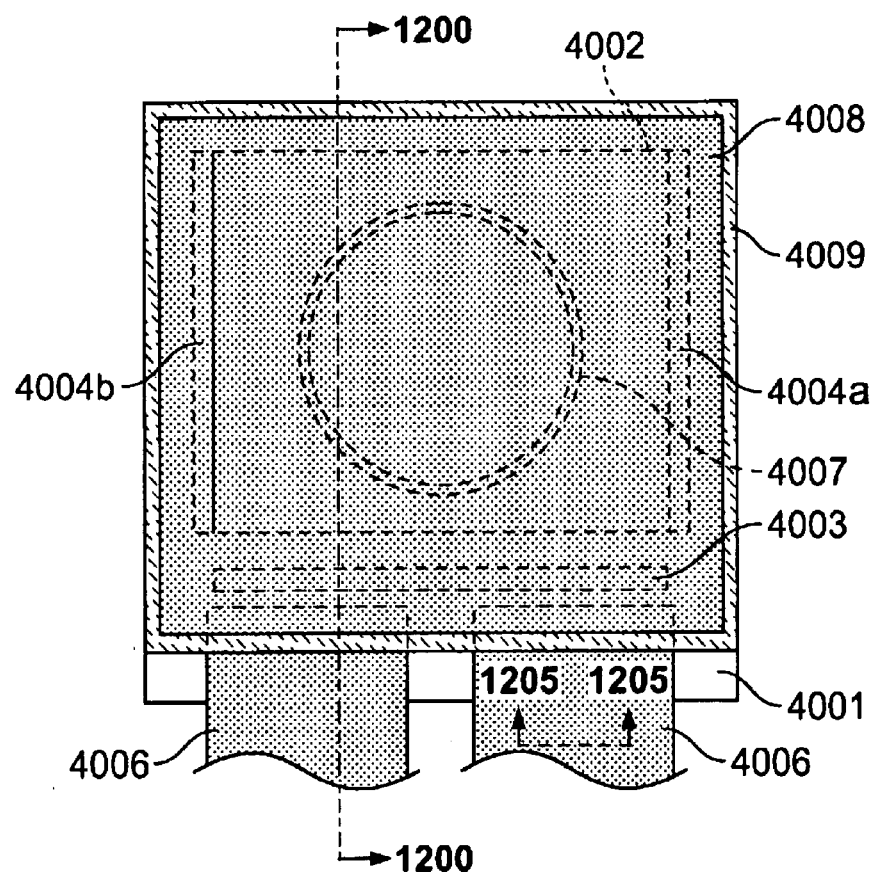
FIGS. 12A to 12C are a top surface diagram and cross sectional diagrams, respectively, of an EL display.
Figure 12B:
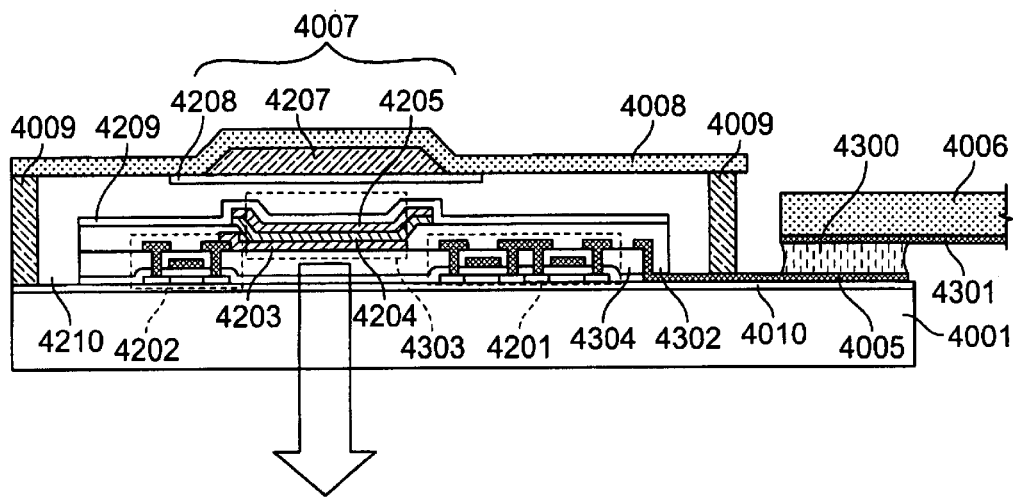
Figure 12C:
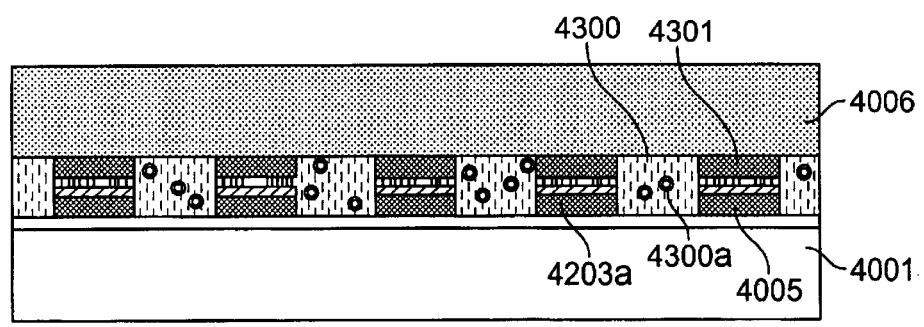

FIG. 12A is a top view of an EL display formed by sealing the TFT substrate shown in FIG. 11A by using a sealing material. FIG. 12B is a cross sectional diagram of FIG. 12A cut along a line segment 1200–1200', and FIG. 12C is a cross sectional diagram of FIG. 12A cut along a line segment 1205–1205', Note that, in FIGS. 12A to 12C. the same reference numerals are used for portions already shown in FIGS. 11A and 11B.

A sealant 4009 is formed so as to surround the pixel portion 4002, the source signal line driver circuit 4003, and the first and the second gate signal line driver circuits 4004a and 4004b formed on the substrate 4001. Further, a sealing material 4008 is formed on the pixel portion 4002, the source signal line driver circuit 4003, and the first and the second gate signal line driver circuits 4004a and 4004b. The pixel portion 4002, the source signal line driver circuit 4003, and the first and the second gate signal line driver circuits 4004a and 4004b are therefore hermetically sealed by the substrate 4001, the sealant 4009, and the sealing material 4008, by means of a filler material 4210.

Further, the pixel portion 4002, the source signal line driver circuit 4003, and the first and the second gate signal line driver circuits 4004a and 4004b formed on the substrate 4001 have a plurality of TFTs. Typically, driver TFTs (note that an n-channel TFT and a p-channel TFT are shown in the figures here) 4201 contained in the source signal line driver circuit 4003, and EL driver TFTs (TFTs for controlling electric current to organic EL elements) 4202 are formed on a base film 4010 as shown in FIG. 12B.

P-channel TFTs or n-channel TFTs manufactured by a known method are used in the driver TFTs 4201 in Embodiment 4, and the p-channel TFTs manufactured by the known method are used in the EL driver TFTs 4202. Further, storage capacitors (not shown in the figures) connected to gates of the EL driver TFTs 4202 are provided.

An interlayer insulating film (leveling film) 4304 is formed on the driver TFT 4201 and the EL driver TFT 4202, and a pixel electrode (anode) 4203 electrically connected to a drain of the EL driver TFT 4202 is formed on the interlayer insulating film 4304. A transparent conductive film having a large work function is used for the pixel electrode 4203. A chemical compound of indium oxide and tin oxide, a chemical compound of indium oxide and zinc oxide, zinc oxide, tin oxide, and indium oxide can be used for the transparent conductive film. Further, the transparent conductive film to which gallium is added may also be used.

An insulating film 4302 is then formed on the pixel electrode 4203, and an opening portion is formed in the insulating film 4302 over the pixel electrode 4203. An EL (electroluminescence) layer 4204 is formed on the pixel electrode 4203 in the opening portion. Known organic EL materials can be used for the EL layer 4204. Further, there are low molecular weight (monomer) organic EL materials and high molecular weight (polymer) organic EL materials, and either may be used.

A known evaporation technique or a known application technique may be used as a method of forming the EL layer 4204. Further, the EL layer may have a single layer structure or a lamination structure in which a hole injecting layer, a hole transporting layer, a light emitting layer, an electron transporting layer, and an electron injecting layer are freely combined.

A cathode 4205 made from a conductive film having light shielding properties (typically a conductive film having aluminum, copper, or silver as its main component, or a lamination film of such a conductive film with another conductive film) is formed on the EL layer 4204. Further, it is preferable to remove as much as possible any moisture and oxygen existing in the interface between the cathode 4205 and the EL layer 4204. It is therefore necessary to employ a mechanism for forming the EL layer 4204 in a nitrogen or inert gas atmosphere, and then forming the cathode 4205 without exposure to oxygen or moisture. The above stated film deposition is possible in Embodiment 4 by using a film deposition apparatus of a multi-chamber method (cluster tool method). A predetermined voltage is then imparted to the cathode 4205.

An organic EL element 4303 comprising the pixel electrode (anode) 4203, the EL layer 4204, and the cathode 4205 is thus formed. A protective film 4303 is then formed on the insulating film 4302 so as to cover the organic EL element 4303. The protective film 4303 is effective in preventing contaminants such as oxygen and moisture from entering the organic EL element 4303.

Reference numeral 4005*a* indicates an extraction wiring connected to a power source supply line, and the extraction wiring 4005*a* is electrically connected to a source region of the EL driver TFT 4202. The extraction wiring 4005*a* passes between the sealant 4009 and the substrate 4001, and is electrically connected to an FPC wiring 4301 of the FPC 4006 through an anisotropic conductive film 4300.

Glass materials, metallic materials (typically stainless steel materials), ceramic materials, and plastic materials (including plastic films) can be used as the sealing material 4008. An FRP (fiberglass reinforced plastics) plate, a PVF (polyvinyl fluoride) film, a mylar film, a polyester film, and an acrylic resin film can be used as the plastic material. Further, a sheet having a structure in which an aluminum foil is sandwiched by PVF films or mylar films can also be used.

However, a cover material must be transparent if the direction of light emitted from the organic EL elements is toward the cover material. In this case, a transparent substance such as a glass plate, a plastic plate, a polyester film, or an acrylic film is used.

Further, in addition to an inert gas such as nitrogen or argon, an ultraviolet hardened resin or an infrared hardened resin can be used as a filler material 4210, PVC (polyvinyl chloride), acrylic, polyimide, epoxy resin, silicon resin, PVB (polyvinyl butyryl) and EVA (ethylene vinyl acetate) can be used. Nitrogen is used as the filler material in Embodiment 4.

In order to place the filler material 4210 in a moisture absorbing substance (preferably barium oxide) or a substance which can adsorb oxygen in, a concave portion 4007 is formed on the substrate 4001 side surface of the sealing material 4008, and a moisture absorbing substrate or a substance which can adsorb oxygen 4207 is arranged in the concave portion 4007. The moisture absorbing substance or the substance which can adsorb oxygen 4207 is maintained in the concave portion 4007 by a concave portion cover material 4208 so that the moisture absorbing substance or the substance which can adsorb oxygen 4207 does not fly off. Note that the concave portion cover material 4208 has a structure with a fine mesh shape, and that air and moisture can pass through, but the moisture absorbing substance or the substance which can adsorb oxygen 4207 does not pass through. Degradation of the organic EL element 4303 can be suppressed by forming the moisture absorbing substance or the substance which can adsorb oxygen 4207.

A conductive film 4203*a* is formed so as to contact the extraction wiring 4005*a*, at the same time as the pixel electrode 4203 is formed, as shown in FIG. 12C.

Further, the anisotropic conductive film 4300 has a conductive filler 4300*a*. By thermal press fitting of the substrate 4001 and the FPC 4006, the conductive film 4203*a* on the substrate 4001 and the FPC wiring 4301 on the FPC 4006 are electrically connected by the conductive filler 4300*a*.

Note that it is possible to implement Embodiment 4 by freely combining it with any of Embodiments 1 to 3.

[Embodiment 5]

In the EL display device of the present invention, a method of simultaneously forming, on the same substrate, a pixel portion and TFTs (n-channel TFT and p-channel TFT) of a driver circuit formed in the periphery of the pixel portion, is described in detail using FIGS. 13 to 16 in this embodiment.

First, in this embodiment, a substrate 300 is used, which is made from glass, such as barium borosilicate glass or aluminum borosilicate, represented by such as Corning #7059 glass and #1737. Note that, as the substrate 300, a quartz substrate, or a silicon substrate, a metal substrate, or a stainless substrate, on which an insulating film is formed, may be used as the replace. A plastic substrate having heat resistance to a process temperature of this embodiment may also be used.

Then, a base film 301 formed from an insulating film such as a silicon oxide film, a silicon nitride film or a silicon oxynitride film. In this embodiment, a two-layer structure is used as the base film 301. However, a single-layer film or a lamination structure consisting of two or more layers of the insulating film may be used. As a first layer of the base film 301, a silicon oxynitride film 301*a* is formed into a thickness of 10 to 200 nm (preferably 50 to 100 nm) using $SiH_4$, $NH_3$, and $N_2O$ as reaction gases by plasma CVD. In this embodiment, the silicon oxynitride film 301*a* (composition ratio Si=32%, O=27%, N=24% and H=17%) having a film thickness of 50 nm is formed. Then, as a second layer of the base film 301, a silicon oxynitride film 301*b* is formed so as to laminate thereon into a thickness of 50 to 200 nm (preferably 100 to 150 nm) using $SiH_4$ and $N_2O$ as reaction gases by plasma CVD. In this embodiment, the silicon oxynitride film 301b (composition ratio Si=32%, O=59% N=7% and H=2%) having a film thickness of 100 nm is formed.

Subsequently, semiconductor layers 302 to 305 are formed on the base film. The semiconductor layers 302 to 305 are formed from a semiconductor film having an amorphous structure by a known method (a sputtering method, an LPCVD method, or a plasma CVD method), and is subjected to a known crystallization process (a laser crystallization method, a thermal crystallization method, or a thermal crystallization method using a catalyst such as nickel). The crystalline semiconductor film thus obtained is patterned into desired shapes to obtain the semiconductor layers. The semiconductor layers 302 to 305 are formed into the thickness of from 25 to 80 nm (preferably 30 to 60 nm). The material of the crystalline semiconductor film is not particularly limited, but it is preferable to form the film using silicon, a silicon germanium ($Si_xGe_{1-x}$(x=0.001 to 0.02)) alloy, or the like. In this embodiment, 55 nm thick amorphous silicon film is formed by plasma CVD, and then, nickel-containing solution is held on the amorphous silicon film. A dehydrogenating process of the amorphous silicon film is performed (500° C. for one hour), and thereafter a thermal crystallization process is performed (550° C. for four hours) thereto. Further, to improve the crystallinity thereof, laser anneal treatment is performed to form the crystalline silicon film. Then, this crystalline silicon film is subjected to a patterning process using a photolithography method, to obtain the semiconductor layers 302 to 305.

Further, after the formation of the semiconductor layers 302 to 305, a minute amount of impurity element (boron or phosphorus) may be doped to control a threshold value of the TFT.

Besides, in the case where the crystalline semiconductor film is manufactured by the laser crystal method, a pulse oscillation type or continuous-wave type excimer laser, YAG laser, or $YVO_4$ laser may be used. In the case where those lasers are used, it is appropriate to use a method in which laser light radiated from a laser oscillator is condensed by an optical system into a linear beam, and is irradiated to the amorphous semiconductor film. Although the conditions of the crystallization should be property selected by an operator, in the case where the exciter laser is used, a pulse oscillation frequency is set as 300 Hz, and a laser energy density is as 100 to 400 mJ/cm² (typically 200 to 300 mJ/cm²). In the case where the YAG laser is used, it is appropriate that the second harmonic is used to set a pulse oscillation frequency as 30 to 300 kHz, and a laser energy density is set as 300 to 600 mJ/cm² (typically, 350 to 500 mJ/cm²), Then laser light condensed into a linear shape with a width of 100 to 1000 μm, for example, 400 μm is irradiated to the whole surface of the substrate, and an overlapping ratio (overlap ratio) of the linear laser light at this time may be set as 50 to 90%.

A gate insulating film 306 is then formed for covering the semiconductor layers 302 to 305. The gate insulating film 306 is formed from an insulating film containing silicon by plasma CVD or sputtering into a film thickness of from 40 to 150 nm. In the embodiment, the gate insulating film 306 is formed from a silicon oxynitride film into a thickness of 110 nm by plasma CVD (composition ratio Si=32%, O=59%, N=7%, and H=2%). Of course, the gate insulating film is not limited to the silicon oxynitride film, an insulating film containing other silicon may be formed into a single layer of a lamination structure.

Beside, when the silicon oxide film is used, it can be formed by plasma CVD in which TEOS (tetraethyl orthosilicate) and $O_2$ are mixed, with a reaction pressure of 40 Pa, a substrate temperature of from 300 to 400° C. and discharged at a high frequency (13.56 MHZ) power density of 0.5 to 0.8 W/cm². Good characteristics as the gate insulating film can be obtained in the silicon oxide film thus manufactured by subsequent thermal annealing at 400 to 500° C.

Figures 13A, 13B, 13C:
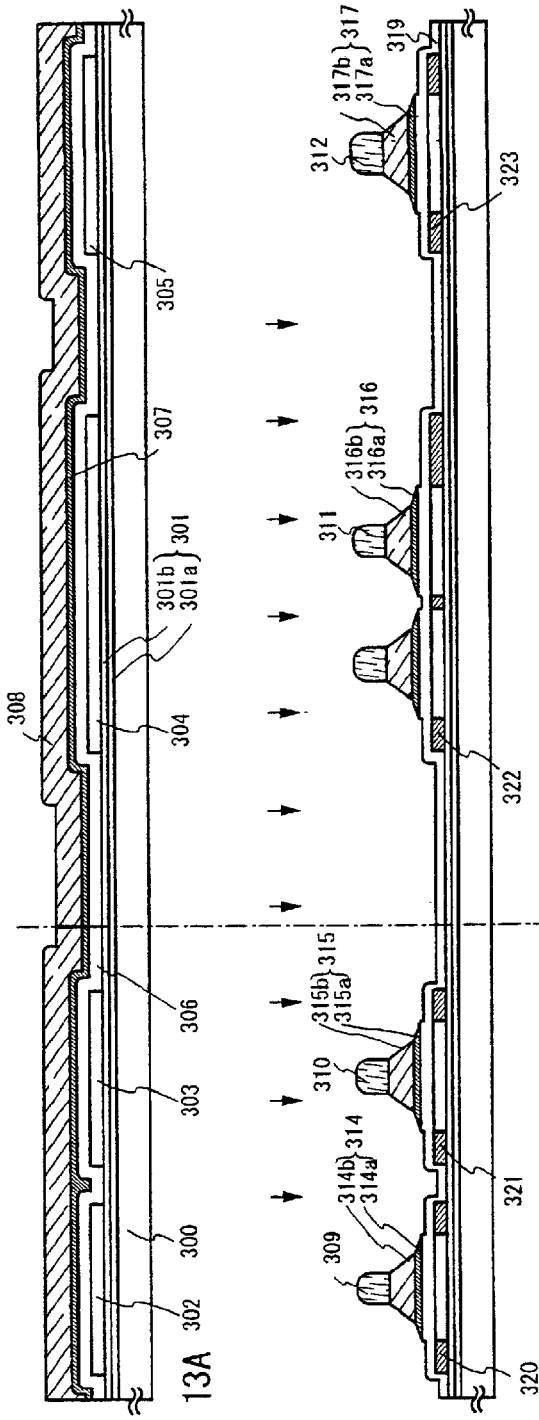
FIGS. 13A to 13C are diagrams showing a method of manufacturing an EL display.

Then, as shown in FIG. 13A, on the gate insulating film 306, a first conductive film 307 and a second conductive film 308 are formed into lamination to have a film thickness of 20 to 100 nm and 100 to 400 nm, respectively. In this embodiment, the first conductive film 307 made from a TaN film with a film thickness of 30 nm and the second conductive film 308 made from a W film with a film thickness of 370 nm are formed into lamination. The TaN film is formed by sputtering with a Ta target under an atmosphere containing nitrogen. Besides, the W film is formed by the sputtering method with a W target. The W film may be formed by thermal CVD using tungsten hexafluoride ($WF_6$). Whichever method is used, it is necessary to make the material have low resistance for use as the gate electrode, and it is preferred that the resistivity of the W film is set to less than or equal to 20 μΩcm. By making the crystal grains large, it is possible to make the W film have lower resistivity. However, in the case where many impurity elements such as oxygen are contained within the W film, crystallization is inhibited and the resistance becomes higher. Therefore, in this embodiment, by forming the W film having high purity by sputtering using a target having a purity of 99.9999% and in addition, by taking sufficient consideration to prevent impurities within the gas phase from mixing therein during the film formation, a resistivity of from 9 to 20 μΩcm can be realized.

Note that, in this embodiment, the first conductive film 307 is made of TaN, and the second conductive film 308 is made of W, but the material is not particularly limited thereto, and either film may be formed of an element selected from Ta, W, Ti, Mo, Al, Cu, Cr and Nd or an alloy material or a compound material containing the above element as its main ingredient. Besides, a semiconductor film typified by a polycrystalline silicon film doped with an impurity element such as phosphorus may be used. Besides, any combination may be employed such as a combination in which the first conductive film is formed of tantalum (Ta) and the second conductive film is formed of W, a combination in which the first conductive film is formed of titanium nitride (TiN) and the second conductive film is formed of W, a combination in which the first conductive film is formed of tantalum nitride (TaN) and the second conductive film is formed of Al, or a combination in which the first conductive film is formed of tantalum nitride (TaN) and the second conductive film is formed of Cu.

Next, masks 309 to 312 made of resist are formed using a photolithography method, and a first etching process is performed in order to form electrodes and wirings as shown in FIG. 13B. This first etching process is performed with the first and second etching conditions. In This embodiment, as the first etching conditions, an ICP (inductively coupled plasma) etching method is used, a gas mixture of $CF_4$, $Cl_2$ and $O_2$ is used as an etching gas, the gas flow rate is set to 25/25/10 sccm, and plasma is generated by applying a 500 W RF (13.56 MHZ) power to a coil shape electrode under 1 Pa. A dry etching device with ICP (Model E645-☐ICP) produced by Matsushita Electric Industrial Co. Ltd. is used here. A 150 W RF (13.56 MHZ) power is also applied to the substrate side (test piece stage) to effectively apply a negative self-bias voltage. The W film is etched with the first etching conditions, and the end portion of the second conductive layer is formed into a tapered shape. In the first etching conditions, the etching rate for W is 200.39 nm/min, the etching rate for TaN is 80.32 nm/min, and the selectivity of W to TaN is about 2.5. Further, the taper angle of W is about 26° with the first etching conditions.

Thereafter, the first etching conditions are changed into the second etching conditions without removing the masks 309 to 312 made of resist, a mixed gas of $CF_4$ and $Cl_2$ is used as an etching gas, the gas flow rate is set to 30/30 sccm, and plasma is generated by applying a 500 W RF (13.56 MHZ) power to a coil shape electrode under 1 Pa to thereby perform etching for about 30 seconds. A 20 W RF (13.56 MHZ) power is also applied to the substrate side (test piece stage) to effectively a negative self-bias voltage. The W film and the TaN film are both etched on the same order with the second etching conditions in which $CF_4$ and $Cl_2$ are mixed. In the second etching conditions, the etching rate for W is 58.97 nm/min, and the etching rate for TaN is 66.43 nm/min. Note that, the etching time may be increased by approximately 10 to 20% in order to perform etching without any residue on the gate insulating film.

In the first etching process, the end portions of the first and second conductive layers are formed to have a tapered shape due to the effect of the bias voltage applied to the substrate side by adopting masks of resist with a suitable shape. The angle of the tapered portions may be set to 15° to 45. Thus, first shape conductive layers 314 to 317 (first conductive layers 314a to 317a and second conductive layers 314b to 317b) constituted of the first conductive layers and the second conductive layers are formed by the first etching process. Reference numeral 319 denotes a gate insulating film, and regions of the gate insulating film which are not covered by the first shape conductive layers 314 to 317 are made thinner by approximately 20 to 50 nm by etching.

Then, a first doping process is performed to add an impurity element for imparting an n-type conductivity to the semiconductor layer without removing the mask made of resist (FIG. 13B). Doping may be carried out by an ion doping method or an ion injecting method. The condition of the ion doping method is that a dosage is $1×10^{13}$ to $5×10^{15}$ atoms/cm$^2$, and an acceleration voltage is 60 to 100 keV. In this embodiment, the dosage is $1.5×10^{15}$ atoms/cm$^2$ and the acceleration voltage is 80 keV. As the impurity element for imparting the n-type conductivity, an element which belongs to group 15 of the periodic table, typically phosphorus (P) or arsenic (As) is used, and phosphorus is used here. In this case, the conductive layers 314 to 317 become masks to the impurity element for imparting the n-type conductivity, and high concentration impurity regions 320 to 323 are formed in a self-aligning manner. The impurity element for imparting the n-type conductivity is added to the high concentration impurity regions 320 to 323 in the concentration range of $1×10^{20}$ to $1×10^{21}$ atoms/cm$^3$.

Thereafter, the second etching process is performed without removing the masks made of resist as shown in FIG. 13C. Here, a mixed gas of $CF_4$, $Cl_2$ and $O_2$ is used as an etching gas, the gas flow rate is set to 20/20/20 sccm, and plasma is generated by applying a 500 W RF (13.56 MHZ) power to a coil shape electrode under 1 Pa to thereby perform etching. A 20 W RF (13.56 MHZ) power is also applied to the substrate side (test piece stage) to effectively apply a negative self-bias voltage. In the second etching process, the etching rate for W is 124.62 nm/min, the etching rate for TaN is 20.67 nm/min, and the selectivity of W to TaN is 6.05. Accordingly, the W film is selectively etched. The taper angle of W is 70° in the second etching. Second conductive layers 324b to 327b are formed by the second etching process. On the other hand, the first conductive layers 314a to 317a are hardly etched, and first conductive layers 324a to 327a are formed.

Next, a second doping process is performed. Second conductive layers 324b to 327b are used as masks to an impurity element, and doping is performed such that the impurity element is added to the semiconductor layer below the tapered portions of the first conductive layers. In this embodiment, phosphorus (P) is used as the impurity element, and plasma doping is performed with the dosage of $1.5×10^{14}$ atoms/cm$^2$, current density of 0.5 µA and the acceleration voltage of 90 keV. Thus, low concentration impurity regions 329 to 332, which overlap with the first conductive layers, are formed in a self-aligning manner. The concentration of phosphorus (P) in the low concentration impurity regions 329 to 332 is $1×10^{17}$ to $5×10^{18}$ atoms/cm$^3$, and has a gentle concentration gradient in accordance with the film thickness of the tapered portions of the first conductive layers. Note that, in the semiconductor layer that overlaps with the tapered portions of the first conductive layers, the concentration of the impurity element slightly falls from the end portions of the tapered portions of the first conductive lasers toward the inner portions. The concentration, however, keeps almost the same level. Further, the high concentration impurity regions 333 to 336 where the high density impurity element is added.

Thereafter, as shown in FIG. 14B, after the masks made of resist are removed, a third etching process is performed using a photolithography method. The tapered portions of the first conductive layers are partially etched so as to have shapes overlapping the second conductive layers in the third etching process. Incidentally, as shown in FIG. 14B. mask 338 made of resist are formed in the regions where the third etching process is not conducted.

The etching conditions in the third etching process are that ICP etching is used, similar to the first and the second etching processes, and $Cl_2$ and $SF_6$ are used as etching gasses, with gas flow rates of 10/50 sccm, respectively. Note that the etching speed of TaN under the third etching process is 111.2 nm/min, and that the etching speed with respect to the gate insulating film is 12.8 nm/min.

A 500 W RF (13.56MHz) electric power is applied to a coil shape electrode under a pressure of 1.3 Pa, plasma is generated, and etching is performed. A 10 W RF (13.56 MHZ) electric power is applied to the substrate (sample stage) side, effectively applying a negative self-bias voltage. First conductive layers 340a to 342a are thus formed.

Impurity regions (LDD regions) 343 to 345 which do not overlap with the first conductive layers 340a to 342a are formed in accordance with the third etching process. Note that an impurity region (GOLD region) 346 remains overlapping with the first conductive layer 324a.

Further, an electrode formed by the first conductive layer 324a and the second conductive layer 324b finally becomes a gate electrode of an n-channel TFT of a driver circuit. An electrode formed by the first conductive layer 340a and the second conductive layer 340b finally becomes a gate electrode of a p-channel TFT of the driver circuit.

Similarly, an electrode formed by the first conductive layer 341a and the second conductive layer 341b finally becomes a gate electrode of an n-channel TFT of a pixel portion. An electrode formed by the first conductive layer 342a and the second conductive layer 342b finally becomes a gate electrode of a p-channel TFT of the pixel portion.

The impurity regions (LDD regions) 343 to 345 which do not overlap with the first conductive layers 340a to 342a, and the impurity region (GOLD region) 346 which overlaps with the first conductive layer 324a can thus be formed at the same time in Embodiment 5, and it becomes possible to make the regions in response to the TFT, characteristics.

The gate insulating film 319 is etched next, $CHF_3$ is used as an etching gas, and reactive ion etching (RIE) is performed for this etching process. In Embodiment 5, the etching process is performed with the chamber pressure set to 6.7 Pa, an RF electric power of 800 W, and a $CHF_3$ gas flow rate set to 35 sccm.

A portion of the high concentration impurity regions 333 to 336 is thus exposed, and insulating films 356a to 356d are formed.

After removing the masks comprising resist new masks 348 and 349 are formed from resist, and a third doping process is performed. Impurity regions 350 to 353, to which an impurity element is added that imparts the opposite conductivity type (p-type) from the single conductivity type (n-type) are formed to the semiconductor layers, which become active layers of p-channel TFTs, by the third doping process, (See FIG. 14C.) The first conductive layers 340a and 342a are used as masks against the impurity element, the impurity element imparting p-type conductivity is added, and the impurity regions are formed in a self-aligning manner.

The impurity regions 350 to 353 are formed in Embodiment 5 by ion doping using diborane ($B_2H_6$). Note that the semiconductor layers which form n-channel TFTs are covered by the resist masks 348 and 349 formed from resist during the third doping process. Phosphorous is added to the impurity regions 350 to 353 in differing concentrations, respectively, by the first doping process and by the second doping process. However, doping is performed such that the concentration of the impurity element which imparts p-type conductivity to each of the regions becomes from $2\times10^{20}$ to $2\times10^{21}$ atoms/$cm^3$, and therefore no problems will develop with the regions functioning as source regions and drain regions of p-channel TFTs.

Impurity regions are formed in the respective semiconductor layers by the process up though this point.

The resist masks 348 and 349 are removed next, and a first interlayer insulating film 357 is formed. An insulting film containing silicon is formed having a thickness of 100 to 200 nm, using plasma CVD or sputtering, as the first interlayer insulating film 357. A silicon oxynitride film is formed with a film thickness of 150 nm by plasma CVD in Embodiment 5. The first interlayer insulating film 357 is of course not limited to the silicon oxynitride film, and other insulating films containing silicon may be used in a single layer or a lamination structure.

Figures 15A, 15B:
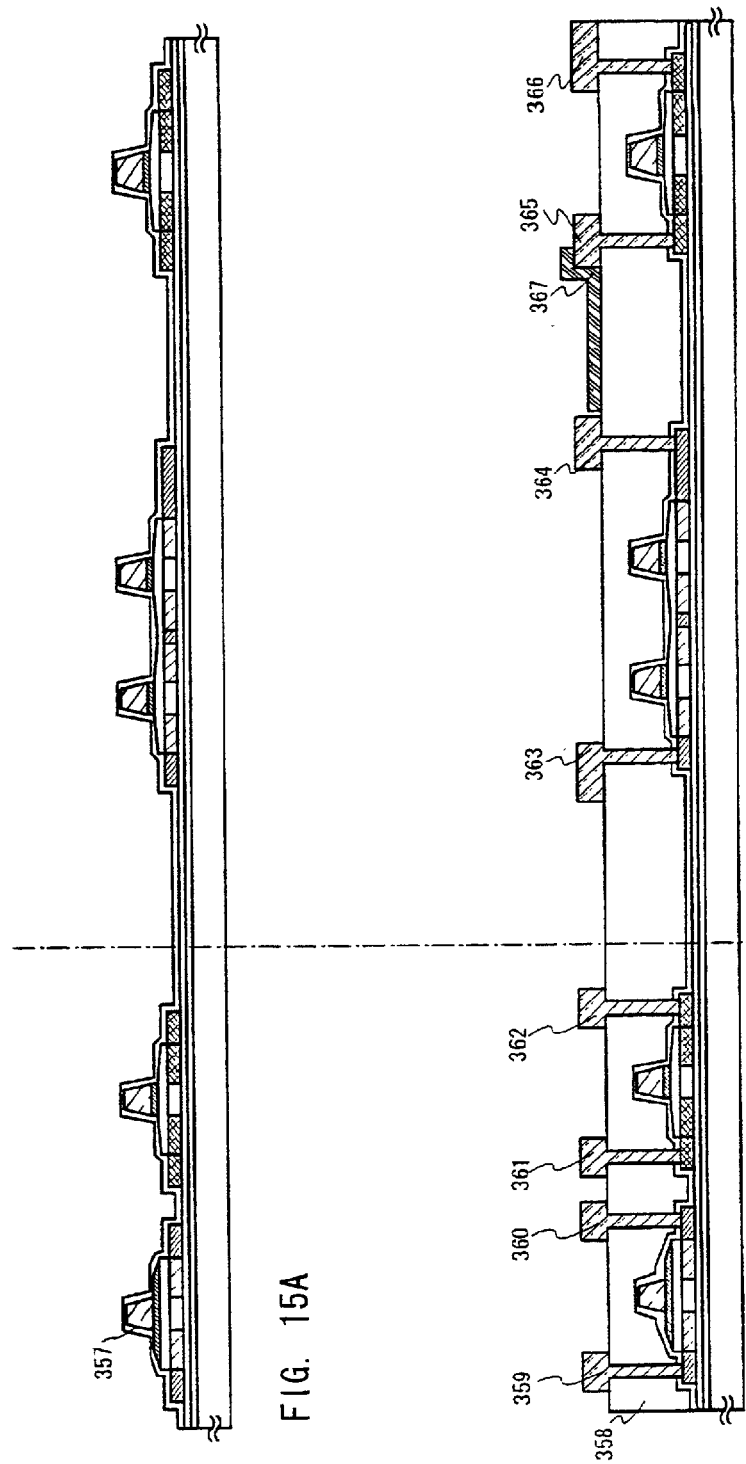
FIGS. 15A and 15B are diagrams showing the method of manufacturing an EL display.

Next, as shown in FIG. 15A, a process for activating the impurity elements added to each of the semiconductor layers is performed. Thermal annealing using an annealing furnace is performed for the activation process. Thermal annealing may be performed in a nitrogen atmosphere having an oxygen concentration of 1 ppm or less preferably 0.1 ppm or less, at 400 to 700° C. typically between 500 and 550° C. The activation process is performed in Embodiment 5 by heat treatment at 550° C. for four hours. Note that, in addition to thermal annealing, laser annealing and rapid thermal annealing (RTA) can also be applied.

Note also that, in Embodiment 5, nickel used as a catalyst during crystallization is gettered into the impurity regions 334 to 336, 350, and 351 containing phosphorous at a high concentration at the same time as the above activation process is performed. The nickel concentration within the semiconductor layers that mainly become channel forming regions is thus reduced. The value of the off current is reduced for TFTs having channel forming regions thus formed, and a high electric field effect mobility is obtained because of the good crystallinity. Thus, good properties can be achieved.

Further, the activation process may also be performed before forming the first interlayer insulating film. However, when using a wiring material which is weak with respect to heat, it is preferable to perform the activation process after forming the interlayer insulating film (insulating film containing silicon as its main constituent, silicon nitride film, for example) in order to protect the wirings and the like, as in Embodiment 5.

The doping process may be performed, and the first interlayer insulating film may be formed after performing the activation process.

In addition, heat treatment is performed for 1 to 12 hours at 300 to 550° C. in an atmosphere containing hydrogen of 3 to 100%, performing hydrogenation of the semiconductor layers. Heat treatment is performed for one hour at 410° C. in a nitrogen atmosphere containing approximately 3% hydrogen in Embodiment 5. This process is one for terminating dangling bonds of the semiconductor layers by hydrogen contained in the interlayer insulating film. Plasma hydrogenation (using hydrogen excited by plasma) may be performed as another means of hydrogenation.

Further, when using a laser annealing method as the activation process, it is preferable to irradiate laser light such as that from an excimer laser or a YAG laser after performing the above hydrogenation process.

A second interlayer insulating film 358 is formed next on the first interlayer insulating film 357 from an organic insulating material, as shown in FIG. 11B. An acrylic resin film having a film thickness of 1.6 μm is formed in Embodiment 5. Patterning is performed next in order to form contact holes for reaching the impurity regions 333, 335, 350, and 351.

A film made from an insulating material containing silicon or an organic resin is used as the second interlayer insulating film 358. Silicon oxide, silicon nitride, and silicon oxynitride can be used as the insulating material containing silicon, and materials such as polyimide, polyamide, acrylic, and BCB (benzocyclobutene) can be used as the organic resin.

A silicon oxynitride film is formed by plasma CVD in Embodiment 5. Note that it is preferable that the film thickness of the silicon oxynitride film be from 1 to 5 μm (more preferably between 2 and 4 μm). The silicon oxynitride film is effective in suppressing degradation of the organic EL element because there is little moisture contained in the film itself.

Further, dry etching or wet etching can be used in forming the contact holes, but considering the problem of static damage during etching, it is preferable to use wet etching.

In addition, the first interlayer insulating film and the second interlayer insulating film are etched at the same time when forming the contact holes. It is therefore preferable to use a material for forming the second interlayer insulating film which has a faster etching speed than that used to form the first interlayer insulating film, considering the shape of the contact hole.

Wirings 359 to 366 for electrically connecting to the impurity regions 333, 335, 350, and 351, respectively, are then formed. The wirings are formed by patterning a lamination film of a 50 nm thick Ti film, and a 500 nm thick alloy film (an Al and Ti alloy film). Other conductive films may also be used.

A transparent conductive film having a thickness of 80 to 120 nm is then formed thereon, and a transparent electrode 367 is formed by patterning. (See FIG. 15B.)

Note that an indium tin oxide (ITO) film, or a transparent conductive film of indium oxide into which 2 to 20% zinc oxide (ZnO) is mixed, is used as the transparent electrode in Embodiment 5.

Further, the transparent electrode 367 is electrically connected to a drain region of a current control TFT by being formed contacting and overlapping a drain wiring 365.

Figure 16:
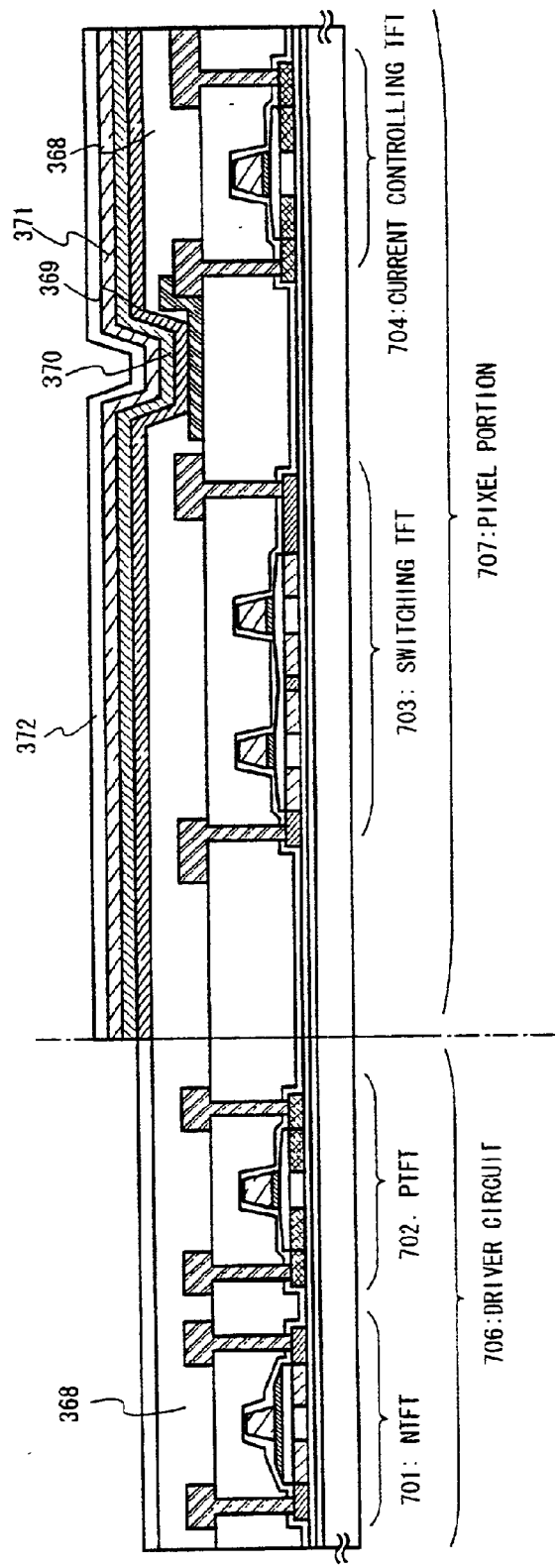
FIG. 16 is a diagram showing the method of manufacturing an EL display.

Next, as shown in FIG. 16, an insulating film containing silicon (a silicon oxide film in Embodiment 5) is formed having a film thickness of 500 nm, and an opening portion is formed in a position corresponding to the transparent electrode 367. A third interlayer insulating film 368 which functions as a bank is formed. Side walls having a tapered shape can easily be formed by using wet etching when forming the opening portion. If the side walls of the opening portion are not sufficiently gentle, then a degradation of the EL layer due to a step becomes a conspicuous problem. Care is therefore necessary.

Note that, although a silicon oxide film is used as the third interlayer insulating film 368 in Embodiment 5, an organic resin film such as polyimide, polyamide, acrylic, or BCB (benzocyclobutene) can also be used, depending upon the circumstances.

An EL layer 369 is formed next as shown by FIG. 16. In addition, a cathode (MgAg electrode) 370 and a protective electrode 371 are formed by evaporation. It is preferable to perform heat treatment on the transparent electrode 367 before forming the EL layer 369 and the cathode 370, completely removing all moisture. Note that, although an MgAg electrode is used as the cathode of the organic EL element in Embodiment 5, other known materials may also be used.

Note also that known materials can be used as the EL layer 369. A two layer structure comprising a hole transporting layer and a light emitting, layer is used as the EL layer in Embodiment 5, but there may be a case where a hole injecting layer, an electron injecting layer, or an electron transporting layer is formed. Many examples of the combinations have already been reported upon, and any of the reported structures may be used.

Polyphenylene vinylene is formed by evaporation as the hole transporting layer in Embodiment 5. Further, a material in which from 30 to 40% of 1,3,4-oxydiazole dielectric PBD is distributed in polyvinyl carbazole is formed by evaporation as the light emitting layer, and approximately 1% cumarin 6 is added as a center of green color light emission.

Further, although it is possible to protect the EL layer 369 from moisture and oxygen by the protective electrode 371, it is preferable to form a passivation film 372. A 300 nm thick silicon nitride film is formed as the passivation film 372 in Embodiment 5. The passivation film may also be formed in succession after forming the protective electrode 371, without exposure to the atmosphere.

The protective electrode 371 is formed in order to prevent degradation of the cathode 370, and is typically made from a metallic film having aluminum as its main constituent. Other materials may also be used, of course. Further, the EL layer 369 and the cathode 370 are extremely weak with respect to moisture and therefore it is preferable to protect the EL layer from the outside atmosphere by performing film formation up through the protective electrode 371 successively, without exposure to the atmosphere.

Note that the film thickness of the EL layer 369 may be from 10 to 400 nm (typically between 60 and 150 nm), and the film thickness of the cathode 370 may be from 80 to 200 nm (typically between 100 and 150 nm).

An EL display device having a structure as shown in FIG. 16 is thus completed. Note that, in the process of manufacturing the EL display device in Embodiment 5, although the source signal lines are formed by Ta and W, the materials which form the gate electrodes, and although the gate signal lines are formed by Al, the wiring material which forms the source and drain electrodes, with relation to the circuit structure and process, other materials may also be used.

Further, a driver circuit 706 having an n-channel TFT 701 and a p-channel TFT 702, and a pixel portion 707 having a switching TFT 703 and an EL driver TFT 704 can be formed on the same substrate.

The n-channel TFT 701 of the driver circuit 706 has the channel forming region 333, the low concentration impurity region 329 (GOLD region) which overlaps with the first conductive layer 324a forming a portion of the gate electrode, and the high concentration impurity region 333 which functions as a source region or a drain region. The p-channel TFT 702 has the channel forming region 373, the impurity region 343 which does not overlap with the first conductive layer 340a structuring a portion of the gate electrode, and the impurity regions 350 and 352 which function as source regions or drain regions.

The switching TFT 703 of the pixel portion 707 has the channel forming region 374, the low concentration impurity region 344 (LDD region) which is formed on the outside of the gate electrode and which does not overlap with the first conductive layer 341a forming the gate electrode, and the high concentration impurity region 335 which functions as a source region or a drain region.

The EL driver TFT 704 of the pixel portion 707 has the channel forming region 375, and the high concentration impurity regions 351 and 353 which function as source regions or drain regions.

Note that it is possible to implement Embodiment 5 by freely combining it with any of Embodiments 1 to 4.

[Embodiment 6]

An EL display device formed by implementing the present invention has superior visibility in bright locations in comparison to a liquid crystal display device because it is a self-emission type device, and moreover its field of vision is wide. Accordingly, it can be used as a display portion for various electronic devices. For example, it is appropriate to use the EL display device of the present invention as a display portion of an EL display (an electro optical device incorporated an EL display to the frame) having a diagonal equal to 30 inches or greater (typically equal to 40 inches or greater) for appreciation of TV broadcasts by large screen.

Note that all displays displaying information such as a personal computer display, a TV broadcast reception display, or an advertisement display are included as the EL display. Further, the EL display device of the present invention can be used as a display portion of the other various electronic devices.

The following can be given as examples of such electronic devices of the present invention: a video camera; a digital camera; a goggle type display (head mounted display); a navigation system; an audio reproducing device (such as a car audio system, an audio compo system); a notebook personal computer; a game equipment; a portable information terminal (such as a mobile computer, a mobile telephone, a mobile game equipment or an electronic book); and an image playback device provided with a recording medium (specifically, a device which performs playback of a recording medium and is provided with a display which can display those images, such as a digital video disk (DVD)). In particular, because portable information terminals are often viewed from a diagonal direction, the wideness of the field of vision is regarded as very important. Thus, it is preferable that the EL display device is employed. Examples of these electronic devices are shown in FIGS. 17 and 18.

Figure 17A:
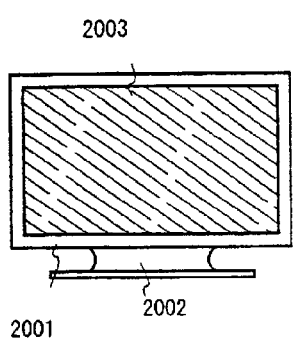
FIGS. 17A to 17F are electronic equipment having an EL display using a driving method of the present invention.

FIG. 17A is EL display device, containing a casing 2001, a support stand 2002, and a display portion 2003. The EL device of the present invention can be used in the display portion 2003. Since the EL display is a self-emission type device with no need of a back light, its display portion can be made thinner than a liquid crystal display device.

Figure 17B:
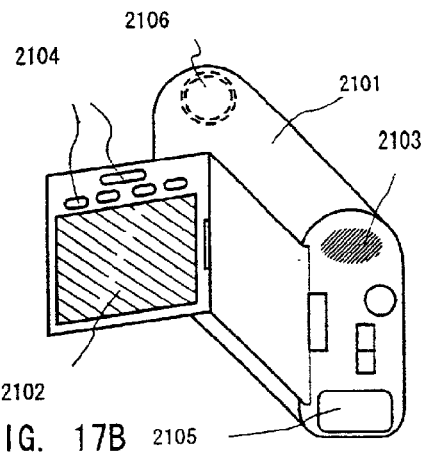

FIG. 17B is a video camera, containing a main body 2101, a display portion 2102, an audio input portion 2103, operation switches 2104, a battery 2105, and an image receiving portion 2106. The EL display device of the present invention can be used in the display portion 2102.

Figure 17C:
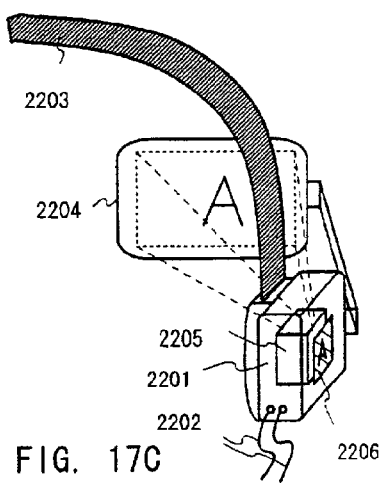

FIG. 17C is a portion of a head mounted type electro optical device (right side), containing a main body 2201, a signal cable 2202, a head fixing band 2203, a screen portion 2204, an optical system 2205, and a display portion 2206. The EL display device of the present invention can be used in the display portion 2206.

Figure 17D:
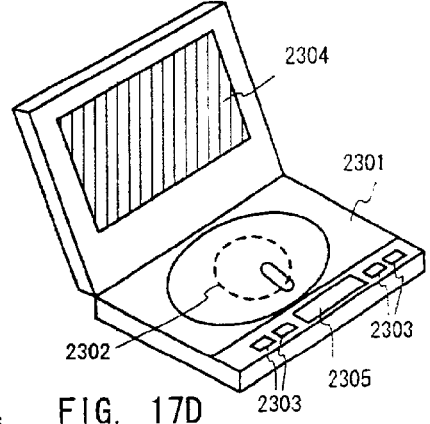

FIG. 17D is an image playback device (specifically, a DVD playback device) provided with a recording medium, containing a main body 2301, a recording medium (such as a DVD) 2302, operation switches 2303, a display portion (a) 2304, and a display portion (b) 2305. The display portion (a) 2304 is mainly, used for displaying image information, and the display portion (b) 2305 is mainly used for displaying character information, and the EL display device of the present invention can be used in the display, portion (a) 2304 and in the display portion (b) 2305. Note that domestic game equipment is included as the image playback device provided with a recording medium.

Figure 17E:
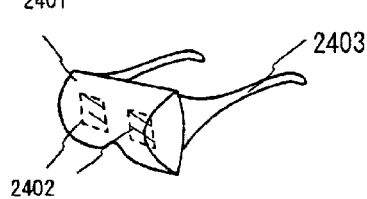

FIG. 17E is a goggle type display device (head mounted display), containing a main body 2401, a display portion 2402, and arm portion 2403. The EL display device of the present invention can be used in the display portion 2402.

Figure 17F:
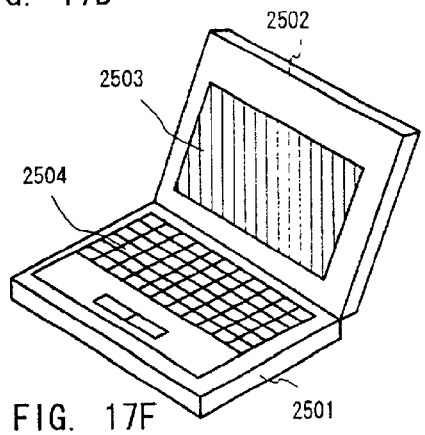

FIG. 17F is a personal computer, containing a main body 2501, a casing 2502, a display portion 2503, and a keyboard 2504. The EL display device of the present invention can be used in the display portion 2503.

Note that if the emission luminance of EL materials becomes higher in the future, it will be possible to use the EL display device of the present invention in a front type or a rear type projector by projecting light including outputted images, which can be enlarged by lenses or the like.

The above electronic devices are becoming more often used to display information provided through an electronic telecommunication line such as the Internet or CATV (cable television), and in particular, opportunities for displaying animation information are increasing. The response speed of organic EL materials is extremely high, and therefore the EL display device is favorable for performing animation display.

Since the light emitting portion of the EL display device consumes power, it is preferable to display information so as to have the emitting portion become as small as possible. Therefore, when using the EL display device in a display portion which mainly displays character information, such as a portable information terminal in particular, a portable telephone and an audio reproducing device, it is preferable to drive it by setting non-emitting portions as background and forming character information in emitting portions.

Figure 18A:
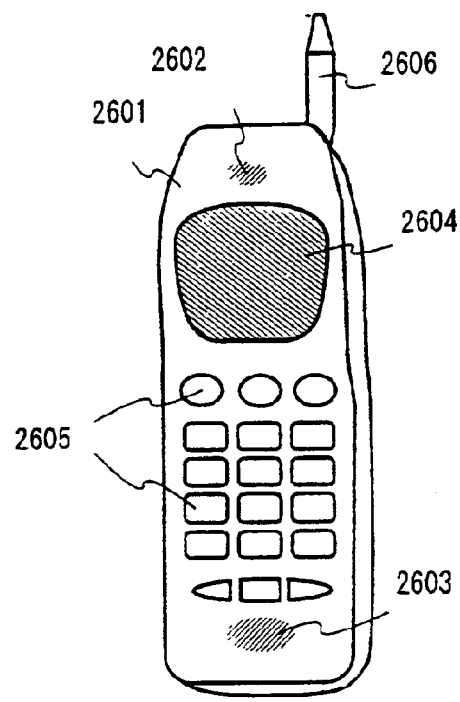
FIGS. 18A and 18B are electronic equipment having an EL display using a driving method of the present invention.

FIG. 18A is a portable telephone, containing a main body 2601, an audio output portion 2602, an audio input portion 2603, a display portion 2604, operation switches 2605, and an antenna 2606. The EL display device of the present invention can be used in the display portion 2604. Note that by displaying white characters in a black background in the display portion 2604, the power consumption of the portable telephone can be reduced.

Figure 18B:
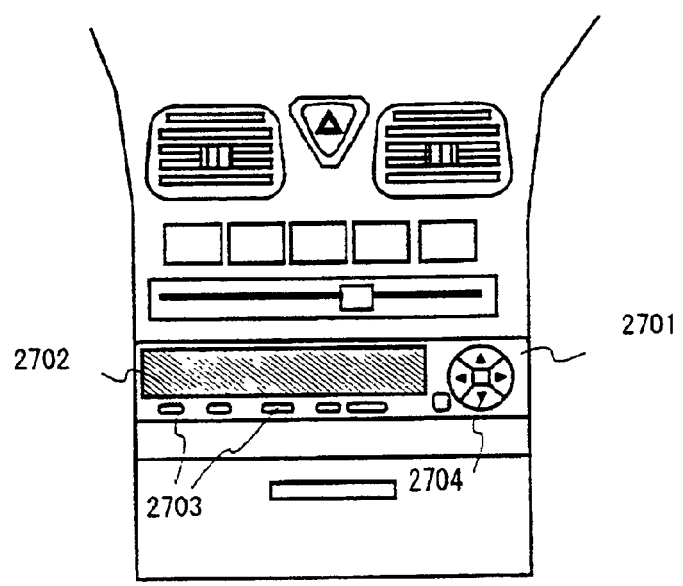
Figure 19A:
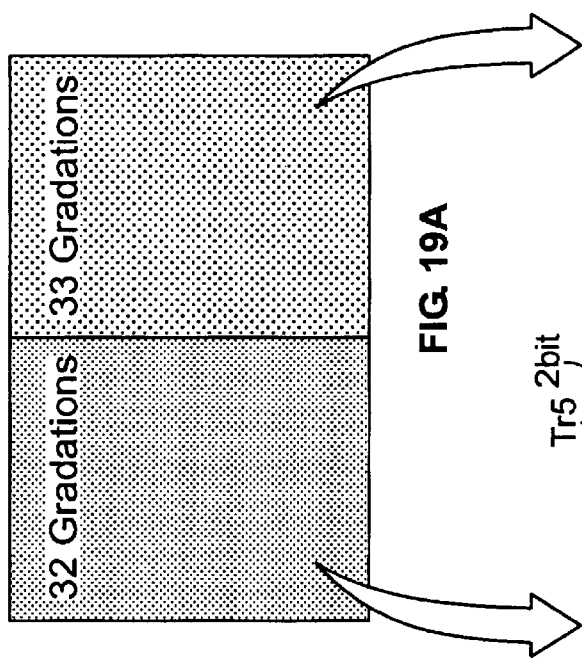
FIGS. 19A and 19B are diagrams showing a pixel portion of an EL display using a conventional driving method, and the ratio of the lengths of a display period and divided display periods, respectively.
Figure 19B:
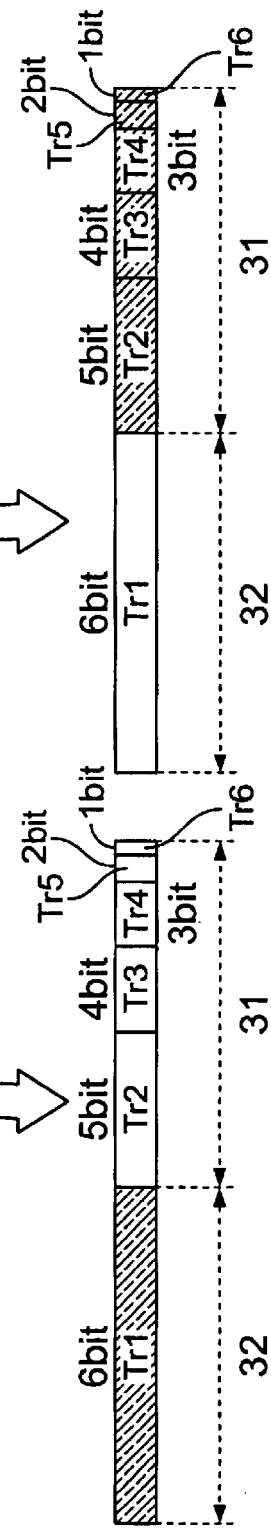
Figure 20A:
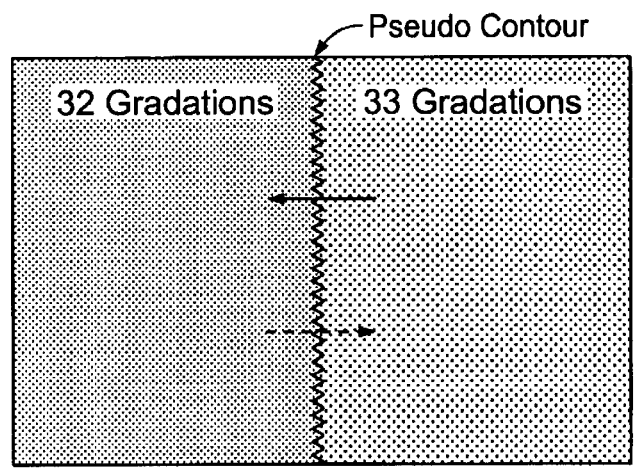
FIGS. 20A and 20B are diagrams showing the pixel portion of the EL display using the conventional driving method, and the ratio of the lengths of display periods and non-display periods, respectively.
Figure 20B:
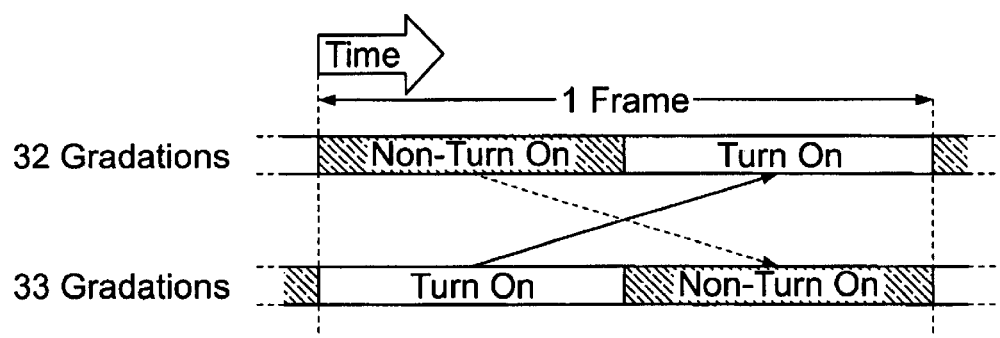

FIG. 18B is an audio reproducing device, specifically a car audio system, containing a main body 2701, a display portion 2702, and operation switches 2703 and 2704. The EL display device of the present invention can be used in the display portion 2702. Furthermore, an audio reproducing device for a car is shown in Embodiment 6, but it may also be used for a portable type and a domestic type of audio reproducing device. Note that by displaying white characters in a black background in the display portion 2702, the power consumption can be reduced. This is particularly effective in a portable type audio reproducing device.

The range of applications of the present invention is thus extremely wide, and it is possible to apply the present invention to electronic devices in all fields. Furthermore, Embodiment 6 can be implemented in combination of any structures of the Embodiments 1 to 5.

The applicable scope of the present invention is thus extremely wide, and it is possible to use the present invention in electronic equipment in all fields. Further, the electronic equipment in Embodiment 6 may also use the EL displays having any of the structures shown in Embodiments 1 to 5.

In the present invention, turn on periods and turn off periods are divided and appear alternately within one frame period. Therefore, even if the visual point of an observer moves slightly left and right, up and down, the likelihood that the visual point of the observer is continuously fixed upon only pixels which are turned off, or conversely is continuously fixed upon only pixels which are turned on, can be lowered. Obstructions to display such as pseudo contours, which are conspicuous in time division drive by a binary code method, can therefore be prevented from being visible.

What is claimed is:

1. A method of driving an EL display device including a plurality of pixels, each having a first TFT, a second TFT, a third TFT, and an organic EL element, the method comprising:

dividing a frame period into n+m display periods with n and m being natural numbers of one or more, wherein the n+m display periods each correspond to one bit of a digital video signal among n bits of the digital video signal, a plurality of display periods, among the n+m display periods correspond to the same bit of the digital video signal, and other display periods corresponding to other bits of the digital video signal, among the n+m display periods, appear between the plurality of display periods;

for each of the n+m display periods, inputting the corresponding bit of the digital video signal to a gate electrode of the second TFT by turning on the first TFT and beginning the respective display period by turning off the third TFT; and after each of the n+m display period begins completing the respective display period by turning on the third TFT;

wherein the organic EL element emits light when the second TFT is turned on, and does not emit light when the second TFT is turned off, wherein the first TFT comprises a crystalline semiconductor film, a gate insulating film over the crystalline semiconductor film, first and second gate electrodes formed over the crystalline semiconductor film with the gate insulating film interposed therebetween, and first and second channel forming regions in the crystalline semiconductor film below the first and second gate electrodes, respectively, and a pair of first impurity regions in the crystalline semiconductor film between the first and second channel forming regions and a third impurity region between the pair of first impurity regions.

2. A method according to claim 1, wherein the first TFT and the second TFT have the same polarity.

3. A method according to claim 1, wherein $Tr_1$, $Tr_2$, $Tr_3, \ldots, Tr_{n-1} = 2^0, 2^1, 2^2, \ldots, 2^{n-2}, 2^{n-1}$, where the lengths of the display periods, among the n+m display periods, corresponding to respective bits of the digital video signal are taken as $Tr_1, Tr_2, Tr_3, \ldots, Tr_{n-1}, Tr_n$.

4. A method according to claim 1, wherein the first TFT functions as a switching TFT, the second TFT functions as an EL driver TFT, and the third TFT functions as an erasing TFT.

5. A method of driving an EL display device including a plurality of pixels, each having a first TFT, a second TFT, a third TFT, and an organic EL element, the method comprising:

dividing a frame period into n+m display periods with n and m being natural numbers of one or more, wherein the n+m display periods each correspond to one bit of a digital video signal among n bits of the digital video signal, a plurality of display periods, among the n+m display period correspond to the most significant bit of the digital video signal, and other display periods corresponding to other bits of the digital video signal, among the n+m display periods, appear between the plurality of display periods;

for each of the n+m display periods, inputting the corresponding bit of the digital video signal to a gate electrode of the second TFT by turning on the first TFT and beginning the respective display period by turning off the third TFT; and after each of the n+m display periods begins, completing the respective display period by turning on the third TFT;

wherein the organic EL element emits light when the second TFT is turned on, and does not emit light when the second TFT is turned off, wherein the first TFT comprises a crystalline semiconductor film, a gate insulating film over the crystalline semiconductor film, first and second gate electrodes formed over the crystalline semiconductor film with the gate insulating film interposed therebetween, and first and second channel forming regions in the crystalline semiconductor film below the first and second gate electrodes, respectively, and a pair of first impurity regions in the crystalline semiconductor film between the first and second channel forming regions and a third impurity region between the pair of first impurity regions.

6. A method according to claim 5, wherein the first TFT and the second TFT have the same polarity.

7. A method according to claim 5, wherein $Tr_1$, $Tr_2$, $Tr_3, \ldots, Tr_{n-1} = 2^0, 2^1, 2^2, \ldots, 2^{n-2}, 2^{n-1}$, where the lengths of the display periods, among the n+m display periods, corresponding to respective bits of the digital video signal are taken as $Tr_1, Tr_2, Tr_3, \ldots, Tr_{n-1}, Tr_n$.

8. A method according to claim 5, wherein the first TFT functions as a switching TFT, the second TFT functions as an EL driver TFT, and the third TFT functions as an erasing TFT.

9. A method of driving an EL display device including a plurality of pixels, each having a first TFT, a second TFT, a third TFT, and an organic EL element, the method comprising:

dividing a frame period into n+m display periods with n and m being natural numbers of one or more, wherein the n+m display periods each correspond to one bit of a digital video signal among n bits of the digital video signal, upper bits of the digital video signal correspond to a plurality of display periods among the n+m display periods, and other display periods corresponding to other bits of the digital video signal, among the n+m display periods, appear between the plurality of display periods;

for each of the n+m display periods, inputting the corresponding bit of the digital video signal to a gate electrode of the second TFT by turning on the first TFT and beginning the respective display period by turning off the third TFT; and after each of the n+m display periods begins, completing the respective display period by turning on the third TFT;

wherein the organic EL element emits light when the second TFT is turned on, and does not emit light when the second TFT is turned off, wherein the first TFT comprises a crystalline semiconductor film, a gate insulating film over the crystalline semiconductor film, first and second gate electrodes formed over the crystalline semiconductor film with the gate insulating film interposed therebetween, and first and second channel forming regions in the crystalline semiconductor film below the first and second gate electrodes, respectively, and a pair of first impurity regions in the crystalline semiconductor film between the first and second channel forming regions and a third impurity region between the pair of first impurity regions.

10. A method according to claim 9, wherein the first TFT and the second TFT have the same polarity.

11. A method according to claim 9, wherein $Tr_1$, $Tr_2$, $Tr_3, \ldots, Tr_{n-1} = 2^0, 2^1, 2^2, \ldots, 2^{n-2}, 2^{n-1}$, where the lengths of the display periods, among the n+m display periods, corresponding to respective bits of the digital video signal are taken as $Tr_1, Tr_2, Tr_3, \ldots, Tr_{n-1}, Tr_n$.

12. A method according to claim 9, wherein the first TFT functions as a switching TFT, the second TFT functions as an EL driver TFT and the third TFT functions as an erasing TFT.

13. A method of driving an EL display device including a plurality of pixels, each having a first TFT, a second TFT and an organic EL element, the method comprising:

dividing a frame period into n+m display periods with n and m being natural numbers of one or more, wherein the n+m display periods each correspond to one bit of a digital video signal among n bits of the digital video signal, a plurality of display periods, among the n+m display periods, correspond to the same bit of the digital video signal, and other display periods corresponding to other bits of the digital video signal, among the n+m display periods, appear between the plurality of display periods;

for each of the n+m display periods, inputting the corresponding bit of the digital video signal to a gate electrode of the second TFT by turning on the first TFT; and after each of the n+m display periods begins completing the respective display period by beginning another display period;

wherein the organic EL element emits light when the second TFT is turned on, and does not emit light when the second TFT is turned off, wherein the first TFT comprises a crystalline semiconductor film, a gate insulating film over the crystalline semiconductor film, first and second gate electrodes formed over the crystalline semiconductor film with the gate insulating film interposed therebetween, and first and second channel forming regions in the crystalline semiconductor film below the first and second gate electrodes, respectively, and a pair of first impurity regions in the crystalline semiconductor film between the first and second channel forming regions and a third impurity region between the pair of first impurity regions.

14. A method according to claim 13, wherein the first TFT and the second TFT have the same polarity.

15. A method according to claim 13, wherein $Tr_1, Tr_2, Tr_3, \ldots, Tr_{n-1} = 2^0, 2^1, 2^2, \ldots, 2^{n-2}, 2^{n-1}$, where the lengths of the display periods, among the n+m display periods, corresponding to respective bits of the digital video signal are taken as $Tr_1, Tr_2, Tr_3, \ldots, Tr_{n-1}, Tr_n$.

16. A method according to claim 13, wherein the first TFT functions as a switching TFT and the second TFT functions as an EL driver TFT.

17. A method of driving an EL display device including a plurality of pixels, each having a first TFT, a second TFT, and an organic EL element, the method comprising:

dividing a frame period into n+m display periods with n and m being natural numbers of one or more, wherein the n+m display periods each correspond to one bit of a digital video signal among n bits of the digital video signal, a plurality of display periods, among the n+m display periods, correspond to the most significant bit of the digital video signal, and other display periods corresponding to other bits of the digital video signal, among the n+m display periods, appear between the plurality of display periods;

for each of the n+m display periods, inputting the corresponding bit of the digital video signal to a gate electrode of the second TFT by turning on the first TFT; and after each of the n+m display periods begins, completing the respective display period by beginning of another display period;

wherein the organic EL element emits light when the second TFT is turned on and does not emit light when the second TFT is turned off, wherein the first TFT comprises a crystalline semiconductor film, a gate insulating film over the crystalline semiconductor film, first and second gate electrodes formed over the crystalline semiconductor film with the gate insulating film interposed therebetween, and first and second channel forming regions in the crystalline semiconductor film below the first and second gate electrodes, respectively, and a pair of first impurity regions in the crystalline semiconductor film between the first and second channel forming regions and a third impurity region between the pair of first impurity regions.

18. A method according to claim 17, wherein the first TFT and the second TFT have the same polarity.

19. A method according to claim 17, wherein $Tr_1, Tr_2, Tr_3, \ldots, Tr_{n-1} = 2^0, 2^1, 2^2, \ldots, 2^{n-2}, 2^{n-1}$, where the lengths of the display periods, among the n+m display periods, corresponding to respective bits of the digital video signal are taken as $Tr_1, Tr_2, Tr_3, \ldots, Tr_{n-1}, Tr_n$.

20. A method according to claim 17, wherein the first TFT functions as a switching TFT and the second TFT functions as an EL driver TFT.

21. A method of driving an EL display device including a plurality of pixels, each having a first TFT, a second TFT, and an organic EL element, the method comprising:

dividing a frame period into n+m display periods with n and m being natural numbers of one or more, wherein the n+m display periods each correspond to one bit of a digital video signal among n bits of the digital video signal, upper bits of the digital video signal correspond to a plurality of display periods among the n+m display periods, and other display periods corresponding to other bits of the digital video signal, among the n+m display periods, appear between the plurality of display periods;

for each of the n+m display periods, inputting the corresponding bit of the digital video signal to a gate electrode of the second TFT by turning on the first TFT; and after each of the n+m display periods begins completing the respective display period by beginning another display period;

wherein the organic EL element emits light when the second TFT is turned on and does not emit light when the second TFT is turned off, wherein the first TFT comprises a crystalline semiconductor film, a gate insulating film over the crystalline semiconductor film, first and second gate electrodes formed over the crystalline semiconductor film with the gate insulating film interposed therebetween, and first and second channel forming regions in the crystalline semiconductor film below the first and second gate electrodes, respectively, and a pair of first impurity regions in the crystalline semiconductor film between the first and second channel forming regions and a third impurity region between the pair of first impurity regions.

22. A method according to claim 21, wherein the first TFT and the second TFT have the same polarity.

23. A method according to claim 21, wherein $Tr_1, Tr_2, Tr_3, \ldots, Tr_{n-1} = 2^0, 2^1, 2^2, \ldots, 2^{n-2}, 2^{n-1}$, where the lengths of the display periods, among the n+m display periods, corresponding to respective bits of the digital video signal are taken as $Tr_1, Tr_2, Tr_3, \ldots, Tr_{n-1}, Tr_n$.

24. A method according to claim 21, wherein the first TFT functions as a switching TFT and the second TFT functions as an EL driver TFT.

25. A method according to claim 1, wherein after each of the n+m display periods begins, the respective display periods are completed by the beginning of another display period.

26. A method according to claim 1, wherein after each of the n+m display periods begins, the respective display periods are completed by the third TFT turning on.

27. A method according to claim 5, wherein after each of the n+m display periods begins, the respective display periods are completed by the beginning of another display period.

28. A method according to claim 5, wherein after each of the n+m display periods begins, the respective display periods are completed by the third TFT turning on.

29. A method according to claim 9, wherein after each of the n+m display periods begins, the respective display periods are completed by the beginning of another display period.

30. A method according to claim 9, wherein after each of the m+m display periods begins, the respective display periods are completed by the third TFT turning on.

31. A method according to claim 13, wherein after each of the n+m display periods begins, the respective display periods are completed by the beginning of another display period.

32. A method according to claim 17, wherein after each of the n+m display periods begins, the respective display periods are completed by the beginning of another display period.

33. A method according to claim 21, wherein after each of the n+m display periods begins, the respective display periods are completed by the beginning of another display period.

34. A method according to claim 1, wherein the first display period is a divided display period in said frame period, and wherein the last display period is a display period in said one frame period.

35. A method according to claim 1, wherein the first display period is one of the plurality of display periods in said frame period, and wherein the last display period is one of the other display periods in said frame period.

36. A method according to claim 5, wherein the first display period is a divided display period in said frame period, and wherein the last display period is a display period in said one frame period.

37. A method according to claim 5, wherein the first display period is one of the plurality of display periods in said frame period, and wherein the last display period is one of the other display periods in said frame period.

38. A method according to claim 9, wherein the first display period is a divided display period in said frame period, and wherein the last display period is a display period in said one frame period.

39. A method according to claim 9, wherein the first display period is one of the plurality of display periods in said frame period, and wherein the last display period is one of the other display periods in said frame period.

40. A method according to claim 13, wherein the first display period is a divided display period in said frame period, and wherein the last display period is a display period in said one frame period.

41. A method according to claim 13, wherein the first display period is one of the plurality of display periods in said frame period, and wherein the last display period is one of the other display periods in said frame period.

42. A method according to claim 17, wherein the first display period is a divided display period in said frame period, and wherein the last display period is a display period in said one frame period.

43. A method according to claim 17, wherein the first display period is one of the plurality of display periods in said frame period, and wherein the last display period is one of the other display periods in said frame period.

44. A method according to claim 21, wherein the first display period is a divided display period in said frame period, and wherein the last display period is a display period in said one frame period.

45. A method according to claim 21, wherein the first display period is one of the plurality of display periods in said frame period, and wherein the last display period is one of the other display periods in said frame period.

* * * * *